United States Patent [19]
Ogawa et al.

[11] Patent Number: 5,963,976
[45] Date of Patent: *Oct. 5, 1999

[54] SYSTEM FOR CONFIGURING A DUPLEX SHARED STORAGE

[75] Inventors: Toshio Ogawa, Fuchu; Akira Kabemoto; Katsuhiko Shioya, both of Yokohama, all of Japan

[73] Assignee: Fujitsu Limited, Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/426,186

[22] Filed: Apr. 21, 1995

Related U.S. Application Data

[62] Division of application No. 08/407,641, Feb. 1, 1995, abandoned, which is a continuation of application No. 07/761,654, Sep. 18, 1991, abandoned.

[30] Foreign Application Priority Data

Sep. 18, 1990 [JP] Japan .................................. 2-248203
Sep. 18, 1990 [JP] Japan .................................. 2-248204

[51] Int. Cl.⁶ .............................. G06F 12/16; G06F 11/16
[52] U.S. Cl. .......................... 711/148; 711/153; 711/162; 395/182.04; 395/846
[58] Field of Search .................................. 395/475, 480, 395/489, 182.04, 846, 441

[56] References Cited

U.S. PATENT DOCUMENTS

| | | | |
|---|---|---|---|
| 3,480,914 | 11/1969 | Schlaeppi | 340/172.5 |
| 3,576,982 | 5/1971 | Duke | 395/182.04 |
| 4,130,865 | 12/1978 | Heart et al. | 395/200.31 |
| 4,313,161 | 1/1982 | Hardin et al. | 711/151 |
| 4,403,283 | 9/1983 | Myritti et al. | 711/2 |

(List continued on next page.)

FOREIGN PATENT DOCUMENTS

| | | |
|---|---|---|
| 0 240 667 | 2/1987 | European Pat. Off. . |
| 0 262 452 | 4/1988 | European Pat. Off. . |

(List continued on next page.)

OTHER PUBLICATIONS

Kabemoto, Akira and Hiroshi Yoshida, "The Architecture of the Sure System 2000 Communications Processor", IEEE Micro, Aug. 1991, vol. 11, No. 4; pp. 28–31, 73–78.

"Department RAID Subsystems No–Fault Insurance"; Infoworld; Feb. 27, 1995; pp. 66 [7].

"Disk Array Performance in a Random IO Environment"; Thomas M. Olson; Computer Architecture News; 1989; pp. 71–77.

Patent Abstracts of Japan, vol. 10, No. 19 (P–423) Jan. 24, 1986 & JP–A–60 173 655 (Nippon Denshin Denwa Kosha) Sep. 7, 1985.

*Primary Examiner*—Reginald G. Bragdon
*Attorney, Agent, or Firm*—Staas & Halsey

[57] ABSTRACT

A shared storage configuration system for use in a computer system includes a plurality of processing modules. Each of the processing modules includes at least a main storage unit, a central processing unit and a connecting unit for connection to a system bus. The shared storage system also includes a plurality of shared storage modules. Each of the shared storage modules includes a shared storage unit and a connection unit for connection to the system bus. A space inherent in the processing modules is accessible by physical addresses of said central processing unit of each of the processing modules. A shared storage space is accessible by the physical addresses of said central processing unit of each of the processing modules. Further, the shared storage space is divided into a partially-shared storage space, a duplex configuration of the shared storage module is defined for each part of the partially-shared storage space, and another shared storage module is specified having an inverted value in a specific bit of its unit ID, in contrast with a unit ID of the shared storage module corresponding thereto.

14 Claims, 23 Drawing Sheets

U.S. PATENT DOCUMENTS

| | | | |
|---|---|---|---|
| 4,591,977 | 5/1986 | Nissen et al. | 395/200.56 |
| 4,710,868 | 12/1987 | Cocke et al. | 395/311 |
| 4,774,712 | 9/1988 | Lewis | 371/49.3 |
| 4,805,097 | 2/1989 | De Sanna | 711/206 |
| 4,823,256 | 4/1989 | Bishop et al. | 395/182.08 |
| 4,914,654 | 4/1990 | Matsuda et al. | 370/522 |
| 5,210,847 | 5/1993 | Thome et al. | 711/138 |
| 5,237,567 | 8/1993 | Nay et al. | 370/438 |
| 5,276,684 | 1/1994 | Pearson | 395/855 |
| 5,430,866 | 7/1995 | Lawrence et al. | 395/182.18 |
| 5,544,347 | 8/1996 | Yanai et al. | 711/162 |

FOREIGN PATENT DOCUMENTS

| | | |
|---|---|---|
| 0 286 856 | 10/1988 | European Pat. Off. . |
| 0 295 897 | 12/1988 | European Pat. Off. . |
| 0 323 123 | 7/1989 | European Pat. Off. . |
| 52-110539 | 9/1977 | Japan . |
| 52-123137 | 10/1977 | Japan . |
| 54-131845 | 10/1979 | Japan . |
| 56-42868 | 4/1981 | Japan . |
| 56-152063 | 11/1981 | Japan . |
| 57-162200 | 10/1982 | Japan . |
| 58-58601 | 4/1983 | Japan . |
| 59-149550 | 8/1984 | Japan . |
| 60-173655 | 9/1985 | Japan . |
| 60-225264 | 11/1985 | Japan . |
| 61-133453 | 6/1986 | Japan . |
| 61-165170 | 7/1986 | Japan . |
| 61-195444 | 8/1986 | Japan . |
| 61-255451 | 11/1986 | Japan . |
| 62-103756 | 5/1987 | Japan . |
| 62-179044 | 8/1987 | Japan . |
| 63-149748 | 6/1988 | Japan . |
| 2-166535 | 6/1990 | Japan . |
| 2 195038 | 7/1986 | United Kingdom . |

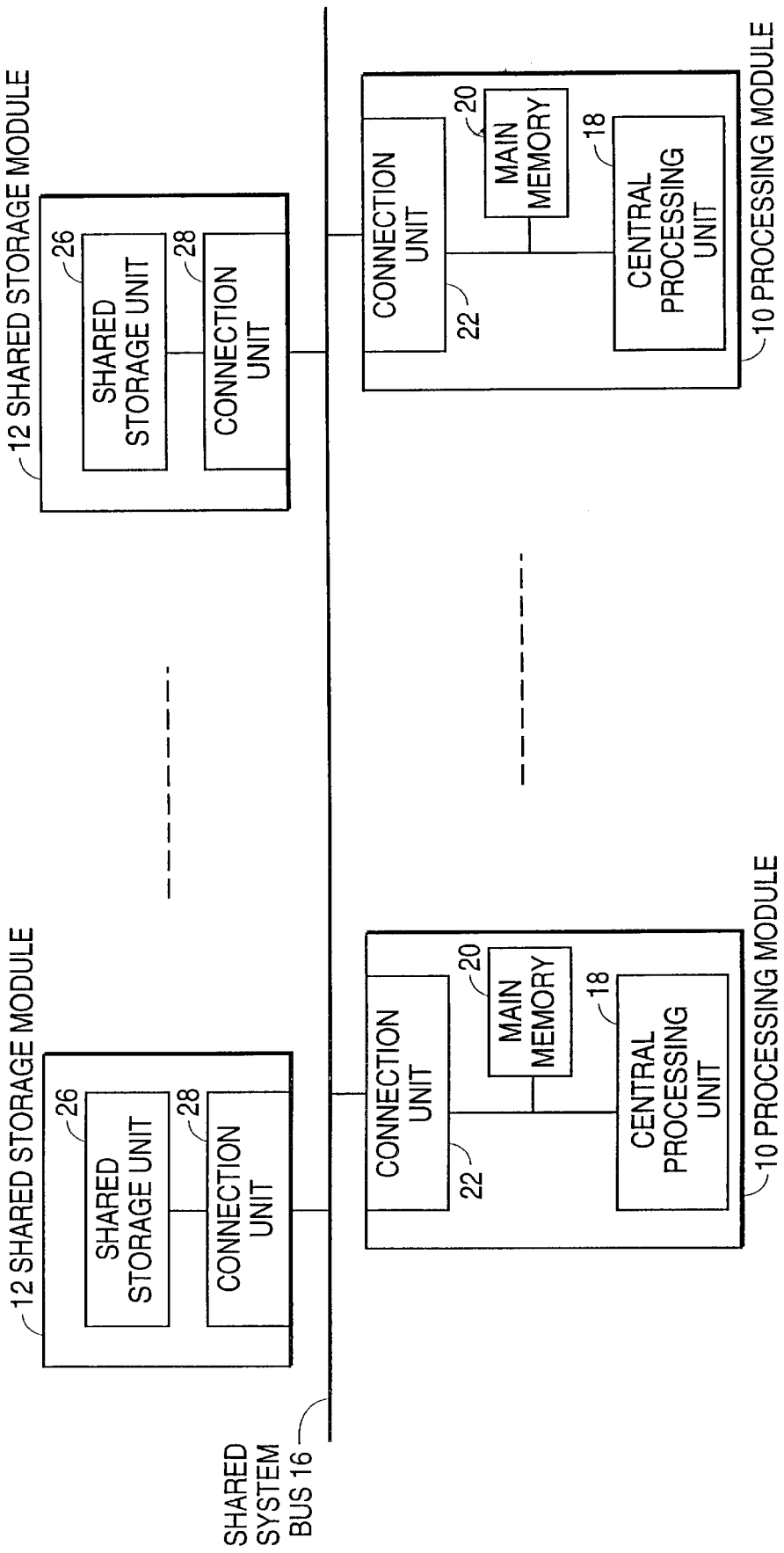

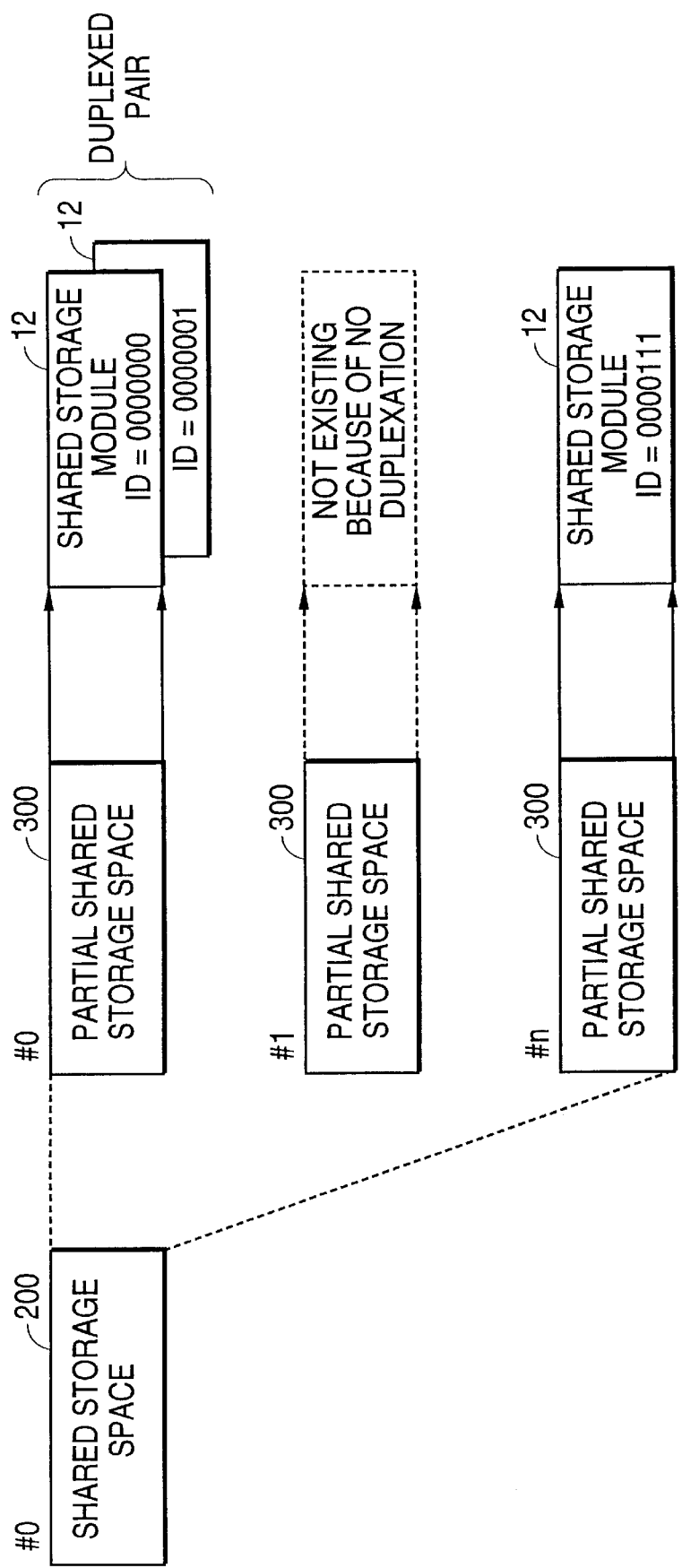

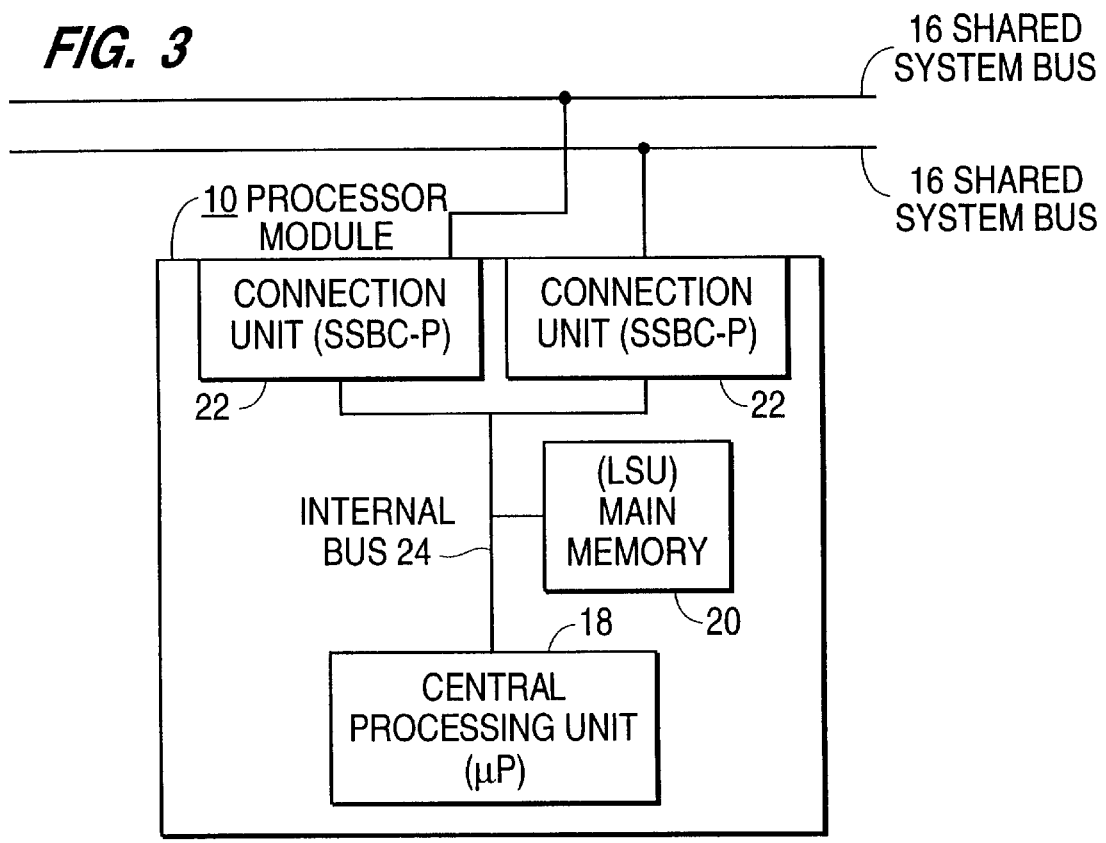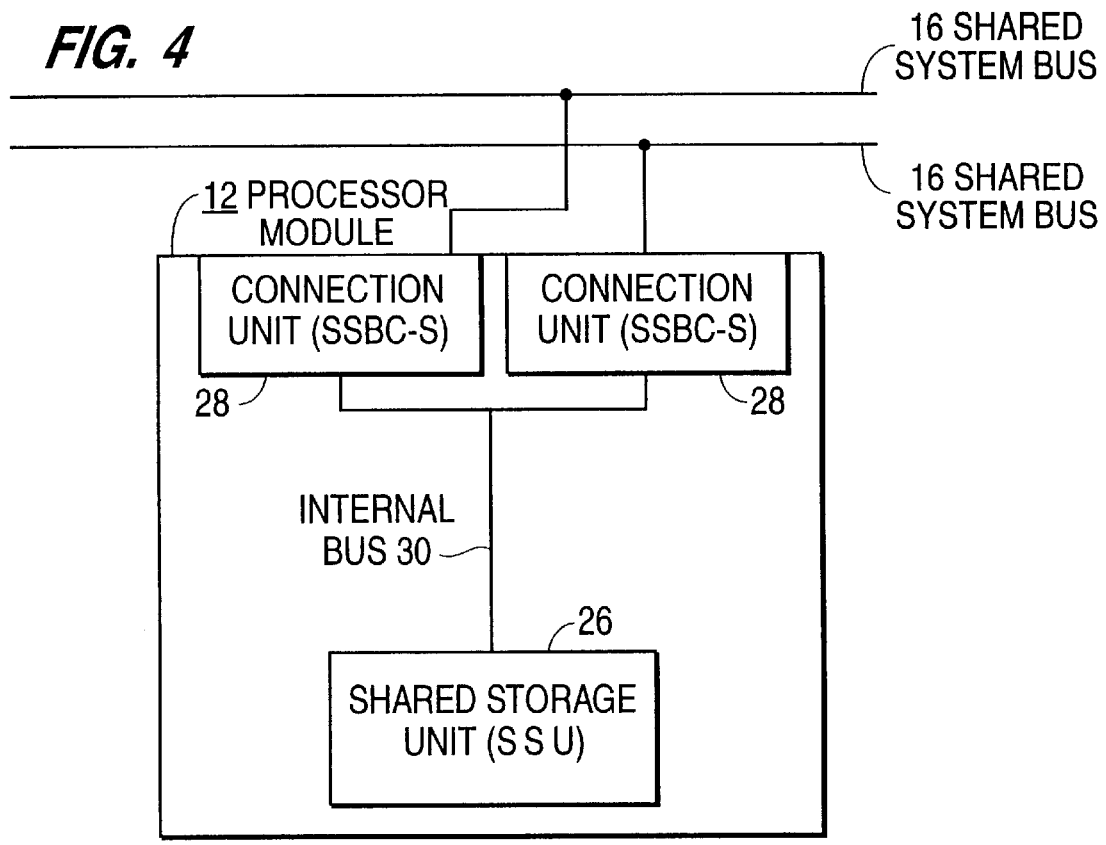

FIG. 12

60 FIRST CONTROL REGISTER

| 1 1 1 0 1 0 0 1 | ****** | ****** | ****** |
|---|---|---|---|

I I I I I I I I
0 1 2 3 4 5 6 7

I0 (INSTALL 0) ··· SPECIFIES THE PRESENCE OR ABSENCE OF SSM CORRESPONDING TO PARTIAL SSU SPACE #0

I1 (INSTALL 1) ··· SPECIFIES THE PRESENCE OR ABSENCE OF SSM CORRESPONDING TO PARTIAL SSU SPACE #1

I2 (INSTALL 2) ··· SPECIFIES THE PRESENCE OR ABSENCE OF SSM CORRESPONDING TO PARTIAL SSU SPACE #2

⋮

I7 (INSTALL 7) ··· SPECIFIES THE PRESENCE OR ABSENCE OF SSM CORRESPONDING TO PARTIAL SSU SPACE #7

I0 ~ I7   0 ··· SPECIFIES THE ABSENCE OF SSM CORRESPONDING TO EACH PHYSICAL ADDRESS

1 ··· SPECIFIES THE EXISTENCE OF SSM CORRESPONDING TO EACH PHYSICAL ADDRESS

FIG. 13

62-1 SECOND CONTROL REGISTER

| 0 | 0000000 | 0 | 0000001 | 1 | 0000010 | * | ******* |
|---|---------|---|---------|---|---------|---|---------|
| D0 | UID0 | D1 | UID1 | D2 | UID2 | D3 | UID3 |

62-2 SECOND CONTROL REGISTER

| 1 | 0000101 | * | ******* | * | ******* | 0 | 0000111 |
|---|---------|---|---------|---|---------|---|---------|
| D4 | UID0 | D5 | UID1 | D6 | UID2 | D7 | UID3 |

D0 · · · SPECIFIES CONFIGURATION OF SSM CORRESPONDING TO PARTIAL SSU SPACE #0 AND ACCESS FORM

D1 · · · SPECIFIES CONFIGURATION OF SSM CORRESPONDING TO PARTIAL SSU SPACE #1 AND ACCESS FORM

D2 · · · SPECIFIES CONFIGURATION OF SSM CORRESPONDING TO PARTIAL SSU SPACE #2 AND ACCESS FORM

⋮

D7 · · · SPECIFIES CONFIGURATION OF SSM CORRESPONDING TO PARTIAL SSU SPACE #7 AND ACCESS FORM

UID0~7 · · · SPECIFIES UNIT-ID ON SSBUS OF SSM CORRESPONDING TO EACH PARTIAL SSU SPACE
LEAST SIGNIFICANT BIT OF UID OF SSU DOUBLE CONFIGURATION IS MADE UP OF "0" AND "1"

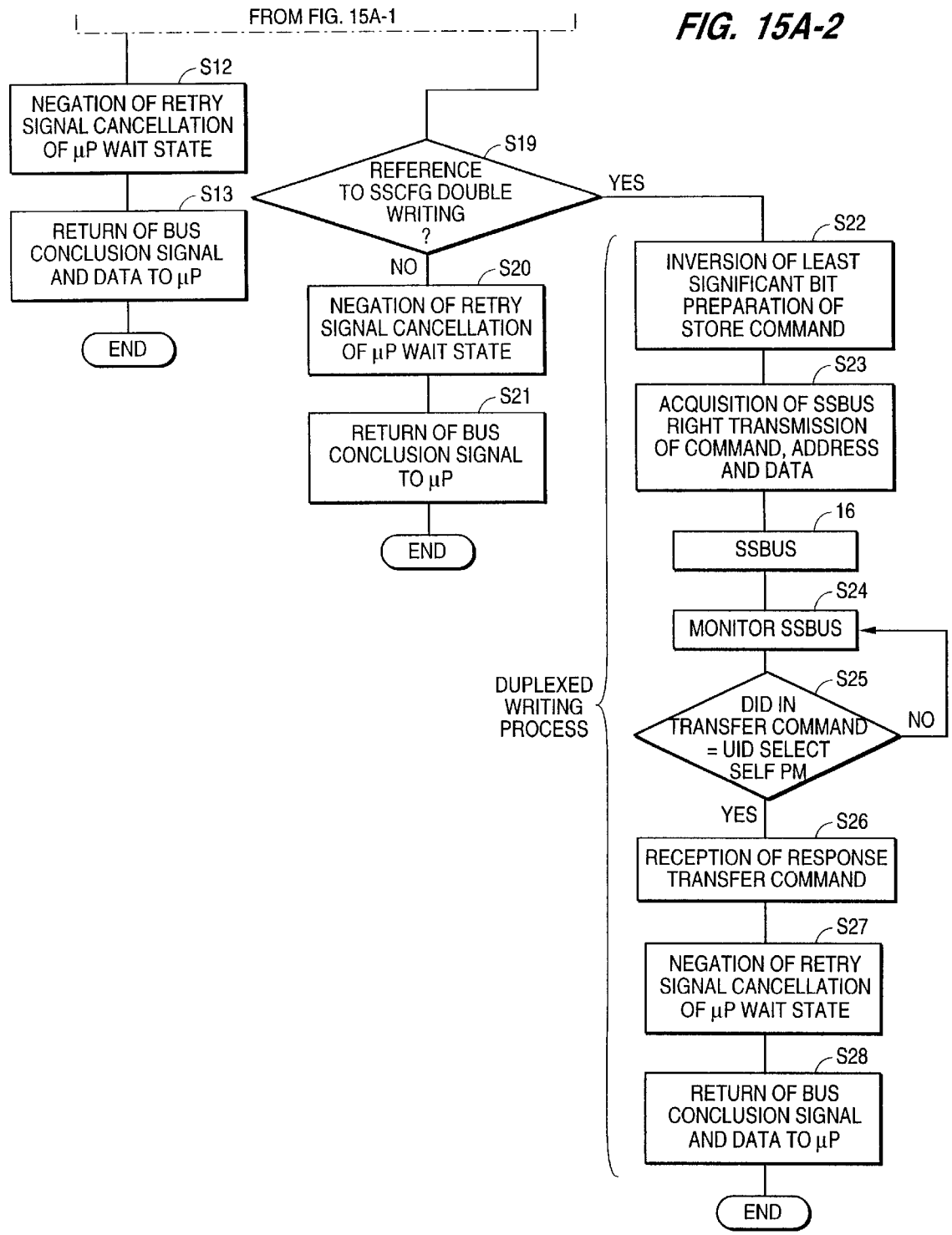

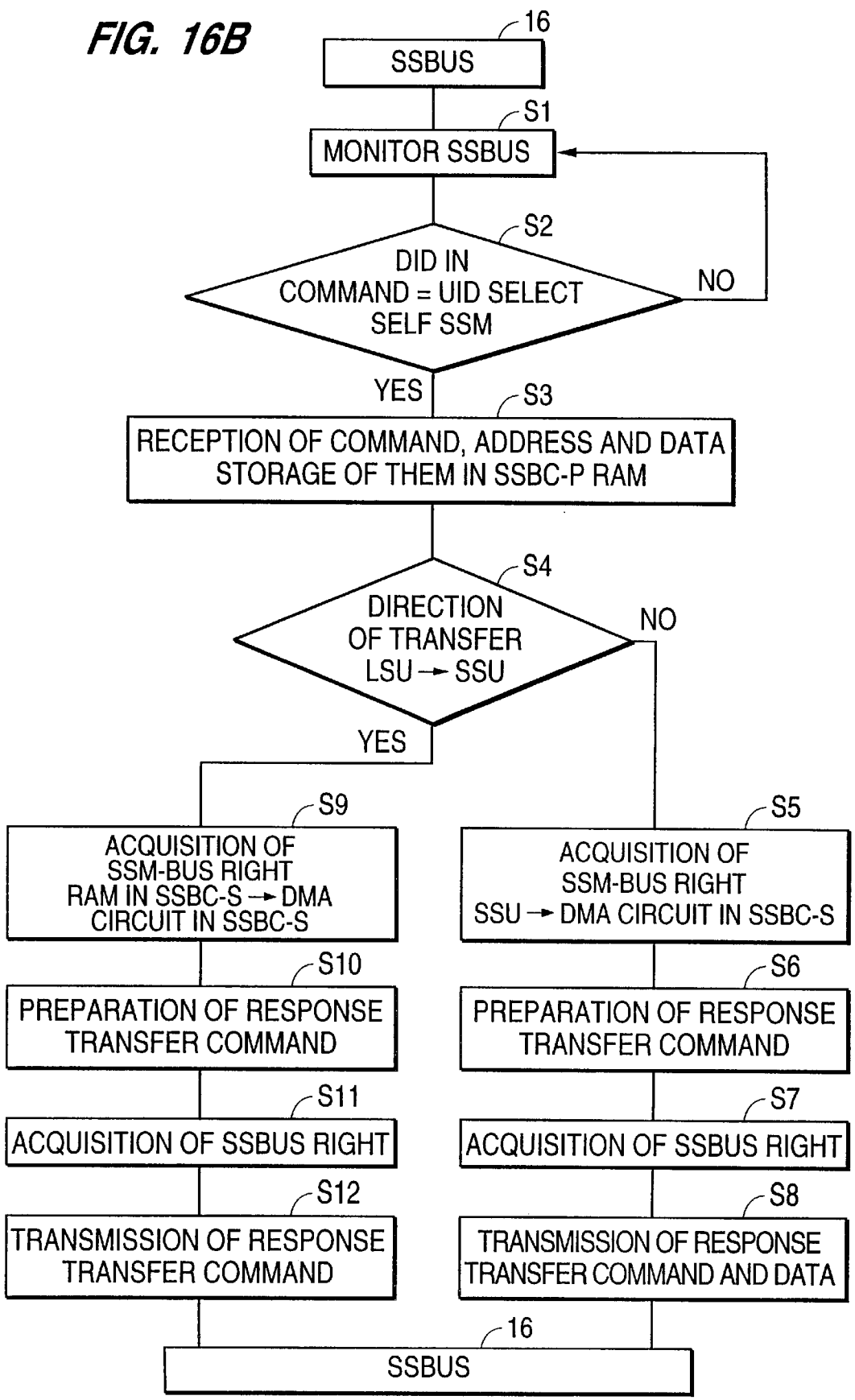

FIG. 17

DESCRIPTOR

|  |  |  | BCT |
|---|---|---|---|
| BUFA |||||
| DID | |||
| SSUA |||||

SYSTEM FOR CONFIGURING A DUPLEX SHARED STORAGE

This application is a division of application Ser. No. 08/407,641, filed Feb. 1, 1995, abandoned, which is a continuation of application Ser. No. 07/761,654, filed Sep. 18, 1991, abandoned.

BACKGROUND OF THE INVENTION

1. Field of the Invention

The present invention relates to a a system for configuring shared storage and a shared storage duplicating system for use with a multiprocessor system in which processor modules and shared storage modules are connected by a system bus.

2. Description of the Related Art

A shared storage device of a multiprocessor system stores instructions and data necessary for processing by multiple processor modules. These processor modules frequently access the shared storage device. If the frequency of access to the shared storage device is high, the number of processor modules which can be built into the system will be limited and consequently, the system's performance will be limited. Furthermore, abnormality in one processor module is apt to be directly linked to abnormality within the whole system. Thus, a shared storage configuration system is desired which permits efficient access to the shared storage device and decreases access frequency.

Specifically, a shared storage for a fault tolerant system requires duplication. However, as the duplex configuration of the shared storage is fixed by hardware, flexible control is not allowed in duplicating the configuration. Besides, in accessing a duplex memory, the software monitors the access as a duplex access, thus being subject to a large process load caused by a duplex write. Therefore, an improved duplicating method is in great demand which allows a change in a duplex configuration and a reduction in load on software during the duplex access.

A conventional multiprocessor system comprises a plurality of processor modules and a plurality of shared storage modules which are connected by a system bus for transfer of information, thereby forming a computer system.

In such a multiprocessor system, instructions and data necessary to a central processing unit of each processor module are stored in the shared storage modules. Hence, each processor module forms a TCMP (Tightly Coupled Multiprocessor) system which frequently accesses the shared storage modules.

In addition, a shared storage duplicating method is indispensable for realizing a fault tolerant multiprocessor system capable of continuous operation even when a fault occurs in a part of the system being operated.

A duplex configuration of a conventional shared storage is determined by the hardware, and an abnormal condition in one of the duplex storages is corrected immediately by a duplicating write where the same data are written, according to a write instruction of a processor based on the software, into a pair of shared storage modules specified as a duplex.

With the TCMP system in which each processor module frequently accesses the shared storage modules, however, there is a limit to the information transfer capability per unit time of the system bus. Thus, if the number of accesses increases, the number of processor modules which can be built into the system will be limited to a considerably small number. Consequently, system performance will also be limited.

In implementing a fault-tolerant computer system which is able to continue functioning without going down even when a fault occurs in part of the system, problems which arise with the conventional system. If an abnormality occurs in one processor module due to an access error, the system bus will be released after a delay with overhead occurring in the other processors due to the extremely frequent access to the shared storage module, which may cause an abnormality of the whole system to occur.

Moreover, in the conventional system, the memory area accessible by the central processing unit of a processor module is limited by the physical addresses of the central processing unit, and thus the area outside the physical address capacity cannot be used as a memory space area. Therefore, it has been extremely difficult to build a computer system that requires vast memory space, for example, one for processing a large-scale data base.

However, shared storage duplication in a fault-tolerant system does not require duplication of all memory areas, but performs duplication only of specific memory areas as required.

However, in the duplicating method in the prior art technology, the duplex configuration of a shared storage is fixed determined by the hardware. Therefore, if the size of the memory areas to be used during the duplicating process fluctuates during system operation, the system must be stopped so that the duplex configuration can be changed by the hardware. This causes a problem in that the duplex configuration cannot be determined flexibly.

In the duplicating method of the prior art technology, software recognizes a duplex access on accessing a duplex memory and monitors the state of the access until data are written twice in the duplex shared storage. Thus, the load on the software becomes large and system efficiency is reduced.

SUMMARY OF THE INVENTION

An object of the present invention is to provide a shared storage configuration system for a computer system which permits efficient access to a shared storage device so as to improve system performance, meet fault-tolerant requirements and increase memory space.

Another object of the present invention is to realize a shared storage duplicating method for a fault tolerant computer system where a duplex configuration can be changed during operation and the load on the software can be reduced during a duplex access.

A feature of the present invention resides in a shared storage configuration system for use in a computer system including a plurality of processing modules each having at least a main memory unit, a central processing unit and a connection unit for connection to a system bus and a plurality of shared storage modules each having a shared storage unit and a connection unit for connection to the system bus. The shared storage configuration system comprises: space inherent in the processing modules which is accessible by physical addresses of the central processing unit of each of the processing modules and shared storage space which is accessible by the physical addresses of the central processing unit of each of the processing modules.

Another feature of the present invention resides in a shared storage duplicating method for specifying a shared storage module corresponding to another shared storage module where a duplex configuration is defined by assigning an inverted value at a specific bit of the unit ID to each other in a computer system comprising: a plurality of process modules having at least a main memory, a central processing unit, and a connection unit for connection to a system bus; and a plurality of shared storage modules having at least a shared storage unit and a connection unit for connection to the system bus, wherein shared storage space accessible dependent on a physical address is divided into plural parts of partially-shared storage space; the existence of a duplex configuration of the shared storage module is defined for each part of the partially-shared storage space; and another shared storage module having an inverted value at a specific bit in its unit ID in contrast with the unit ID of the shared storage module where a duplex configuration is defined is specified as a corresponding module in a pair of storage modules.

BRIEF DESCRIPTION OF THE DRAWINGS

FIGS. 1A to 1E are diagrams for explaining the fundamentals of the present invention;

FIG. 3 is a block diagram of a processor module of the present invention;

FIG. 4 is a block diagram of a shared storage module of the present invention;

FIG. 12 is a diagram for explaining SSM configuration definitions by the first control register according to the present invention;

FIG. 13 is a diagram for explaining SSM configuration definitions by the second control register according to the present invention;

FIGS. 16A and 16B are flowcharts of an accessing process in a Direct Memory Access (DMA) mode according to the present invention; and FIG. 17 is a diagram for explaining a descriptor used in the DMA mode access according to the present invention.

DESCRIPTION OF THE PREFERRED EMBODIMENT

Figure 1B:
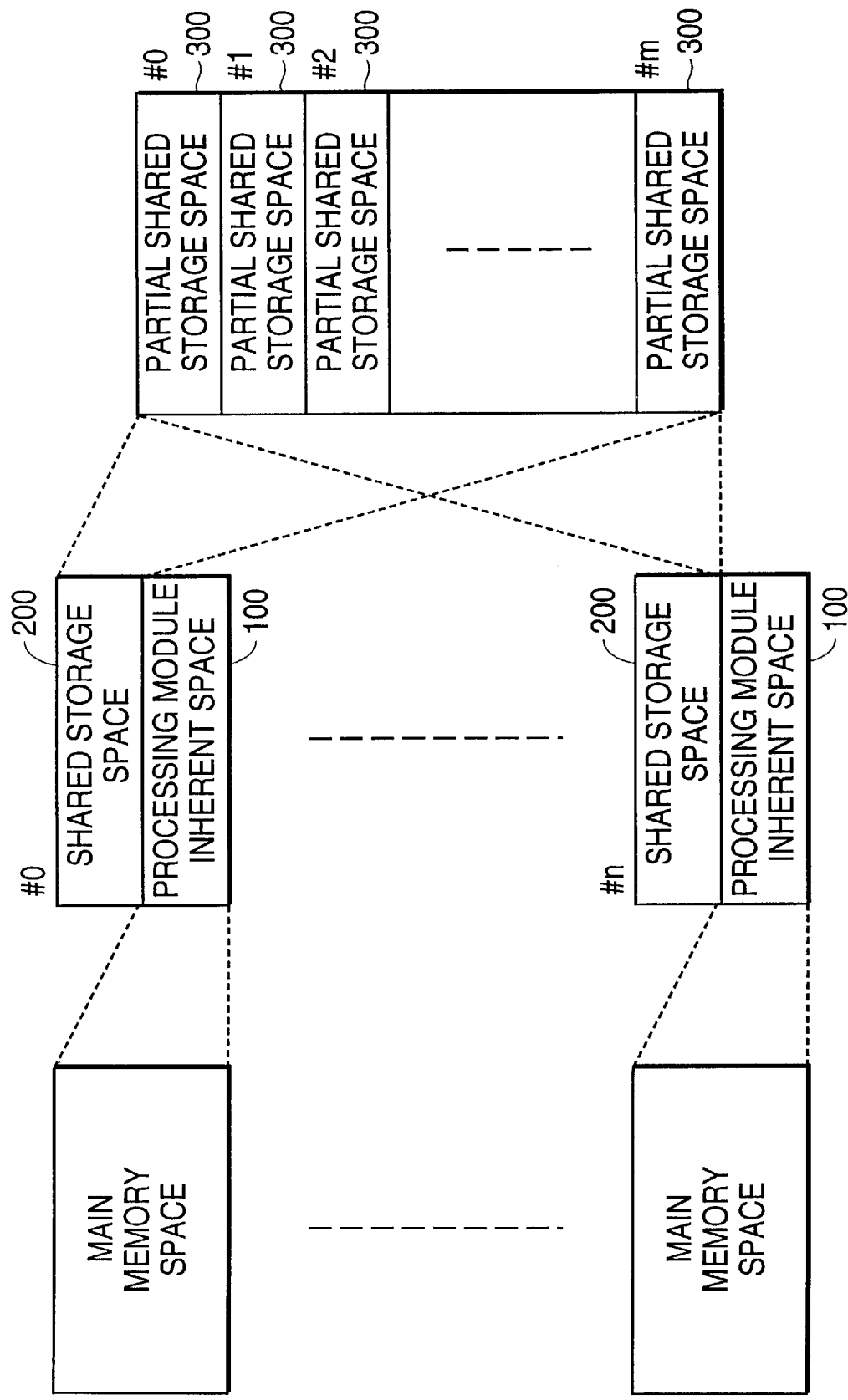

FIGS. 1A to 1E illustrate the fundamentals of the present invention.

As shown in FIG. 1A, the subject of the present invention is a computer system comprising a plurality of processing modules (processor modules) 10 each having at least a main memory 20, a central processing unit 18 and a connection unit 22 for connection to a system bus 16, and a plurality of shared storage modules 12 each having at least a shared storage unit 26 and a connection unit 28 for connection to the system bus 16.

As shown in FIG. 1B, the present invention is characterized, in that, in addition to a space 100 inherent in the processing module which is accessible by physical addresses of the central processing unit 18 of the processing module 10, a shared storage space 200 is provided. This space is likewise accessible by the physical addresses of the central processing unit 18.

The shared storage space 200 is divided into a plurality of partially shared storage spaces 300 and the relationship with the shared storage modules 12 is defined for each of the partially shared storage spaces 300 using a unit 10.

The shared storage modules 12, which have their relationships with the partially-shared storage spaces 300 defined, store data which is to be shared among all the processing units 10.

The main memory 20 is allocated to the processing module inherent space 100 to thereby form multiple space for each of the processing modules 10.

The main memory 20 which is allocated the processing module inherent space 200, stores operands and the processing module's own data required by the central processing unit 18.

Figure 5:
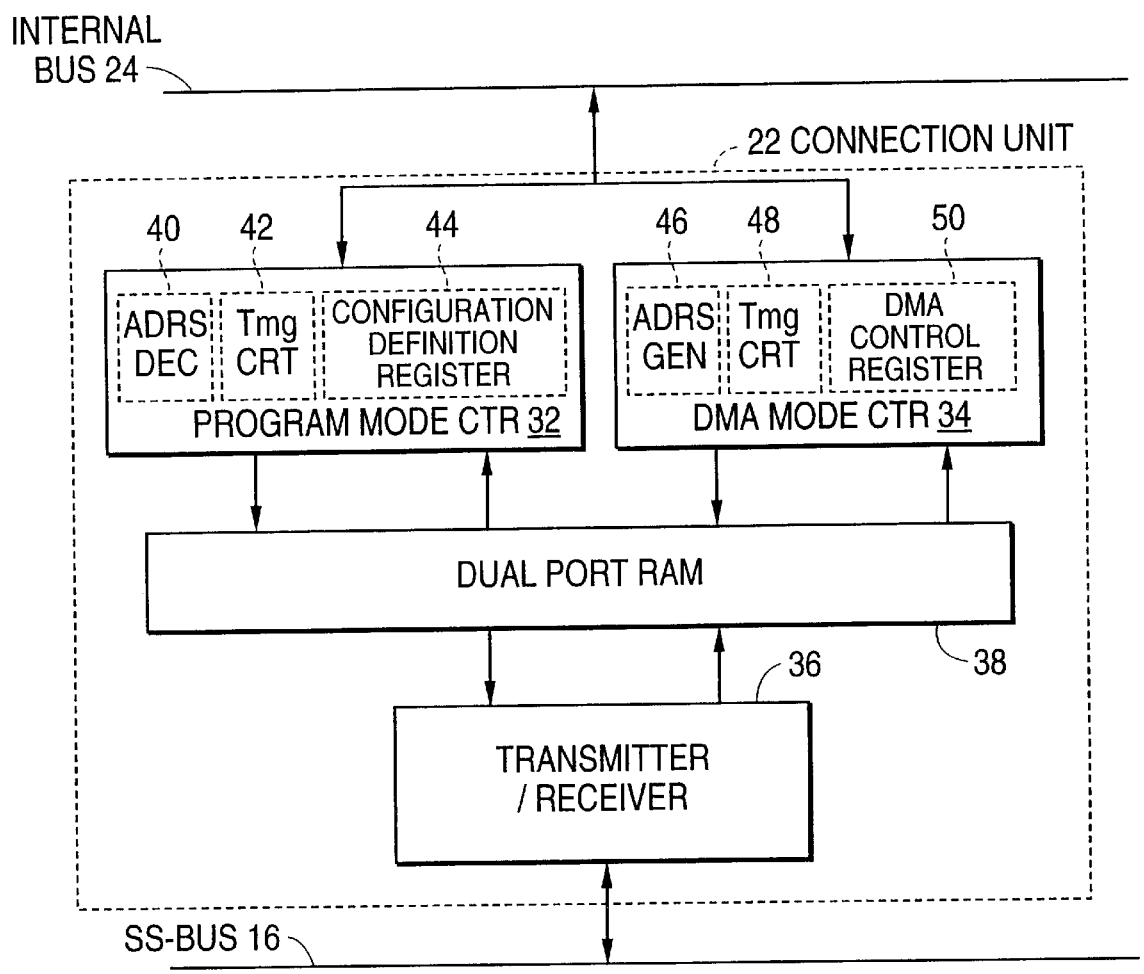
FIG. 5 is a block diagram of a connection unit of the present invention, which is built in the processor module.

As shown in FIG. 5, the connection unit 22 of the processing unit 10 comprises program mode access control means and DMA mode access control means. Program mode access control means is for accessing an arbitrary shared storage module 12 allocated to the shared storage space 200 by the physical addresses of the central processing unit 18 and DMA mode access control means is for translating the physical addresses of the central processing unit 18 to relative addresses for accessing an arbitrary shared storage module (12) allocated the shared storage space 200.

When the central processing unit 18 accesses the shared storage space 200 by its physical address, the program mode access control means of the connection unit 22 translates it to the unit ID of a shared storage module 12, which is a candidate for accessing, and accesses the shared storage module 12 using the resulting unit ID as an identifier on the system bus 16.

The program mode access control means of the connection unit 22 produces a destination ID code (DID) identifying the shared storage module 12 which became a candidate for accessing, a source ID code (SID) representing a source, an operand indicating the type of access, and a start transfer command EC composed of access data capacity BCT. The program mode access control means then transmits the start transfer command EC to the system bus 16 together with an access address A of the destination shared storage module 12.

More specifically, the program mode access control means of the connection unit 22 transmits a start transfer command or start command SC and an access address A at the time of fetch access, and a start transfer command SC, an access address A and data D to be written at the time of store access.

As shown in FIG. 1A, at the time of the transmission from the processing module 10, the connection unit 28 of the shared storage module 12 monitors the system bus 16 and receives the start transfer command SC when its unit ID matches the destination ID code in the start transfer command SC.

Subsequently, the connection unit 28 of the shared storage module 12 responds to the reception of the start transfer command SC to produce an ID code DID indicating the destination processing module 10, a source ID code SID indicating the source and a response transfer command or end command EC containing a conclusion code at the termination of access to the shared storage unit 26, and then transmits them to the system bus 16.

More specifically, the connection unit 28 of the shared storage module 12 transmits only the response transfer command EC at the time of memory access and the response transfer command EC and readout data at the time of fetch access.

In response to the transmission of the response from the shared storage module 12, the connection unit 22 of the processing unit 10 monitors the system bus 16 and receives the response transfer command EC when its unit ID matches the destination ID code in the response transfer command EC.

Furthermore, the connection unit 22 of the processing module 10 is equipped with a configuration control register 44 indicating packaging or unpackaging of the shared storage unit 12 corresponding to the partially shared storage space 300.

Figure 1C:
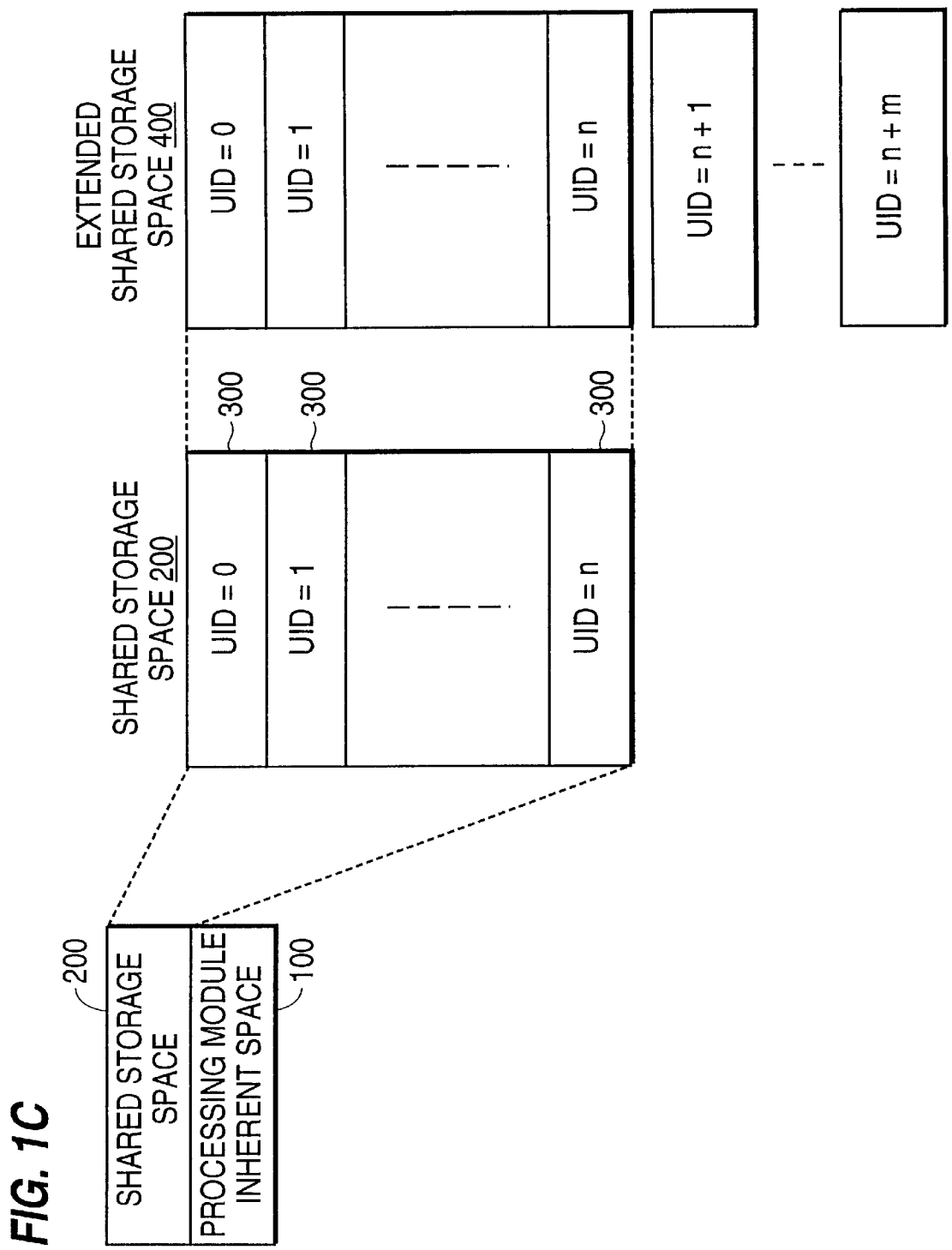

Next, as shown in FIG. 1C, the present invention is characterized, in that, in addition to the shared storage area accessible by the physical addresses of the processing module 10, there is provided extended shared storage space 400 which is accessible by relative addresses by the central processing unit 18.

The shared storage space 200 is divided into the shared storage units 12 each having a fixed memory capacity.

The extended shared storage space 400 also contains the shared storage modules 12 which are allocated the shared storage space 200 accessible by the physical addresses of the central processing unit 18.

Access to the shared storage modules 12 forming the extended shared storage space 400 is made by the DMA mode access control means 34 in the connection unit 22 of the processing unit 10.

The DMA mode access control means 34 specifies a shared storage module 12 in the extended shared storage space 400 with a destination ID code DID in the start transfer command SC and specifies an address of the specified shared storage module 12 with an access address A.

The central processing unit 18 of the processing module 10 allocates a fixed number of bits of address information to a selector for selecting from among the shared storage modules 12 and the remaining bits, to an internal address of a shared storage module 12 specified by the selector when the shared storage space 200 is program-mode accessed.

The present invention is not limited to the computer system of FIG. 1A and may be constructed from a single processing module 10 and more than one shared storage unit 12 which is allocated shared storage space 200 accessible by the physical addresses of the processing module 10. Also, more than one system bus may be provided. In this case, connection units corresponding in number to the system buses are provided in each of the processing modules 10 and shared storage modules 12.

The shared storage configuration system of the present invention configured as described above provides the following effects.

First, instruction codes and data are stored in separate locations, whereby the frequency of access to the shared storage module can be decreased. Therefore, the problem of limited system performance due to the high access frequency can be solved.

The separation of instructions and data is made by the physical addresses of the processing modules and the shared storage space is allocated to space which is common to all of them. However, the local main memory of each processing module is allocated space inherent in its processing unit.

The instruction codes of the central processing unit in the processing module are stored in the main memory unit allocated the processing module's own space. Only data requiring to be shared among the processor modules is stored in the shared storage modules forming the shared storage space.

As a result, the frequency of access to the shared storage modules is considerably reduced, thus increasing the number of processor modules which can be built in the system and improving system performance.

Moreover, since the memory area shared among more than one processing module is reduced, the independence of each processor module is enhanced, thus permitting a fault-tolerant system to be built.

Furthermore, by providing, in addition to the shared storage space serving as the physical address space of the central processing unit, the extended shared storage space which is accessible only by software DMA instructions, it becomes possible to build memory space which is much vaster than the physical address space.

In the configuration of the above described computer system associated with the present invention, as shown in FIG. 1D, a shared storage space 200 capable of being accessed depending on the physical address of the process module 10 is divided by a plurality of partially-shared storage spaces 300, and the existence of a duplex configuration of shared storage modules 12 is defined for each part of the divided partially-shared storage space. Further, to make a duplex memory comprising a shared storage module 12, defined as having a duplex configuration, another shared storage module 12 having an inverted value at a specific bit in its unit ID can be specified. This module is thus generated as a corresponding module in a duplex memory.

For example, to make a duplex memory comprising a shared storage module 12 defined as having a duplex configuration, another shared storage module 12 having an inverted value at the least significant bit in its unit ID in contrast with the corresponding unit ID described above is specified as a corresponding module in a pair of duplex memory modules.

In a duplex access, when a duplex configuration is determined according to a write instruction of the central processing unit 18 based on the software, the hardware of the connection unit 22 performs a first write into one shared storage module 12 having a specified unit ID, then a second write into the other shared storage module 12 having an inverted value at the least significant bit in its unit ID in contrast with the specified unit ID.

Additionally, the connection unit 22 in the process module 10 is provided with a configuration definition register 44 for specifying the existence of a duplex configuration of the shared storage module 12, and then makes a duplicating write access referring to the configuration definition register 44 when it receives a write instruction from the central processing unit 18.

The configuration definition register 44 for specifying the existence of a duplex configuration makes a change during the operation according to the instruction of the central processing unit 18 based on the software.

In the reading access, when the connection unit 22 in the process module 10 receives from the central processing unit 18 an instruction to read a pair of shared storage modules 12 which are specified as having a duplex configuration, a reading access to one of the two shared storage modules 12 having a unit ID is issued by the read instruction of the central processing unit 18.

Figure 1E:
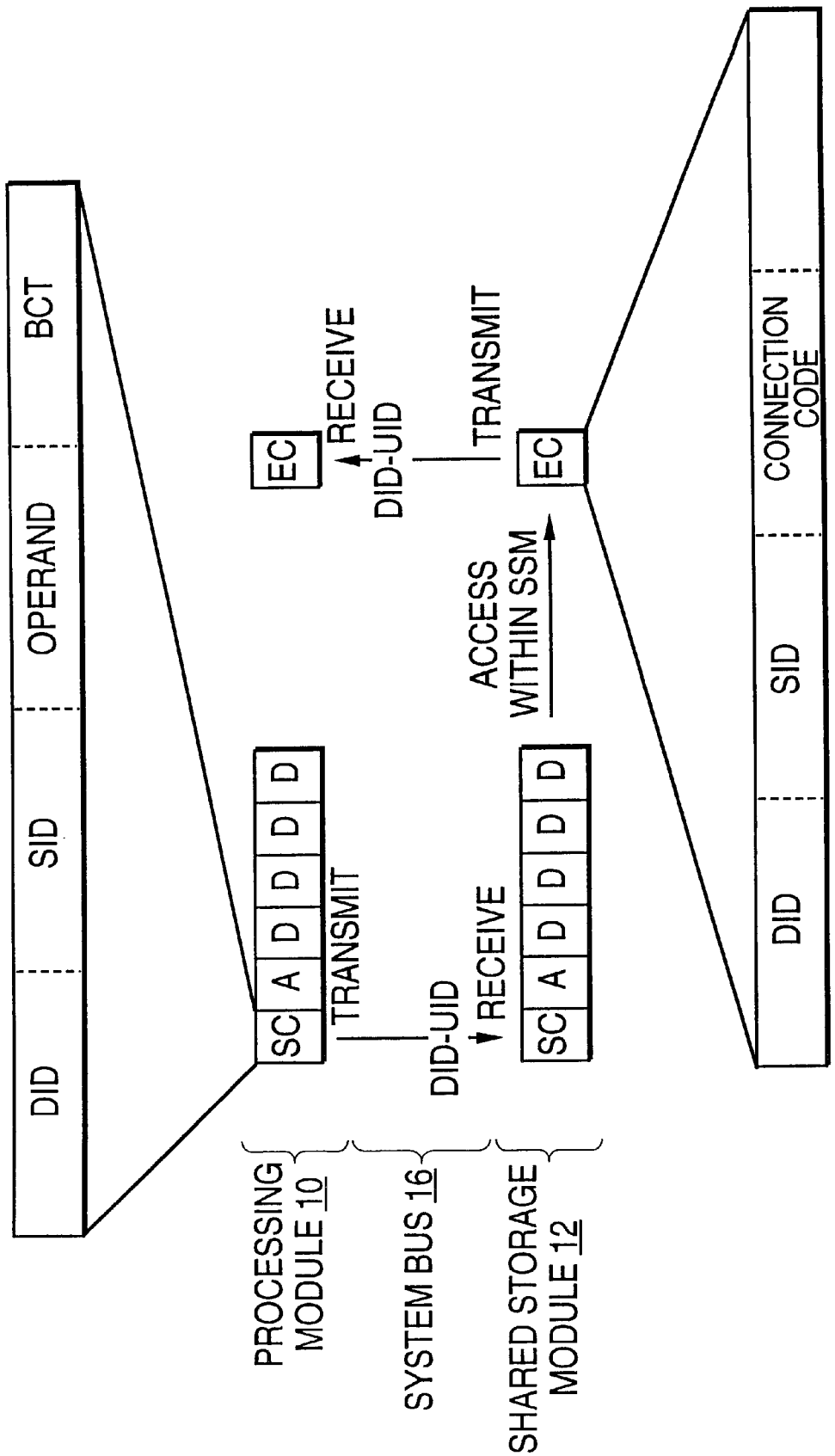

In the transmission through the system bus 16, as shown in FIG. 1E, the connection unit 22 in the process module 10 generates start transmit command (SC) comprising a destination ID code (DID) indicating a shared storage module 12 to be accessed, a source ID code (SID) indicating a source, an operand indicating the type of access, and the access data capacity (BCT). It then transmits the start transmit command (SC) to the above described system bus 16 with the access address (A) of the destination shared storage module 12.

In turn, the connection unit 28 in the shared storage module 12 monitors the system bus 16 and performs an access according to the operand after accepting the start transmit command (SC) when it determines that the destination ID code of the start transmit command (SC) matches its own unit ID.

The connection unit 22 in the process module 10 comprises the following hardware for performing a duplicating write according to the specification of a duplex configuration: a program mode access controller 32 for accessing the shared storage module 12 according to the physical address of the central processing unit 18 and a DMA mode access controller 34 for accessing the shared storage module 12 after converting the physical address of the central processing unit 18 to a relative address.

However, if an abnormal condition is detected during the access to the shared storage module 12, a termination code indicating the detailed information of the abnormal condition and a unit ID of the defective shared storage module 12 are announced to the software of the process module 10.

Specifically, during a duplex access, a termination code indicating the detailed information of an abnormal condition and only the least significant bit in the unit ID in the defective shared storage module 12 are announced to the software of the process module.

That is, as each unit ID of a duplexed storage is assigned an even or odd number ID, announcing only the least significant bit is enough to determine the defective module in the pair.

Further, when the software of the process module 12 is notified of the abnormal termination of the duplex access, a recovery process such as release of duplication, rewrite instruction, switch of the shared storage module 12 to be read, etc. is conducted by changing the content of the configuration definition register 44 provided in the connection unit 22.

The computer system shown in FIG. 1A can comprise a single process module 10 and a plurality of shared storage units 12 provided with shared storage space accessible depending on the physical address of the process module 10.

Further, a plurality of system buses 16 are provided to permit a plurality of connection units 22 to be mounted in the process modules 10 and connection units 28 in the shared storage modules 12 depending on the number of system buses 16.

The shared storage space comprises a plurality of shared storage modules, and the shared storage space is divided into a plurality of partially-shared storage space. According to the configuration definition for defining the relation between each of the divided partially-shared storage spaces and the shared storage modules, the existence of a duplex configuration and a shared storage area can be designated.

A duplex configuration can be defined optionally such that the addition/deletion of a shared storage module and the switch to a simplex/duplex configuration are permitted.

The hardware-operated duplicating write can be easily conducted by limiting it to a pair of shared storage modules having an inverted value at one specific bit and equal values at all the other bits in respective unit IDs.

That is, in a writing access to a shared storage module where a duplex configuration is specified, a write instruction of the software causes the hardware to write into a shared storage module having a specified unit ID, and then to write into the other shared storage module in the duplex configuration with an inverted value applied to the specific bit in contrast with the first unit ID. Therefore, the process load on the software can be reduced without any other software process for the duplex access, thus greatly improving the system performance.

Figure 2:
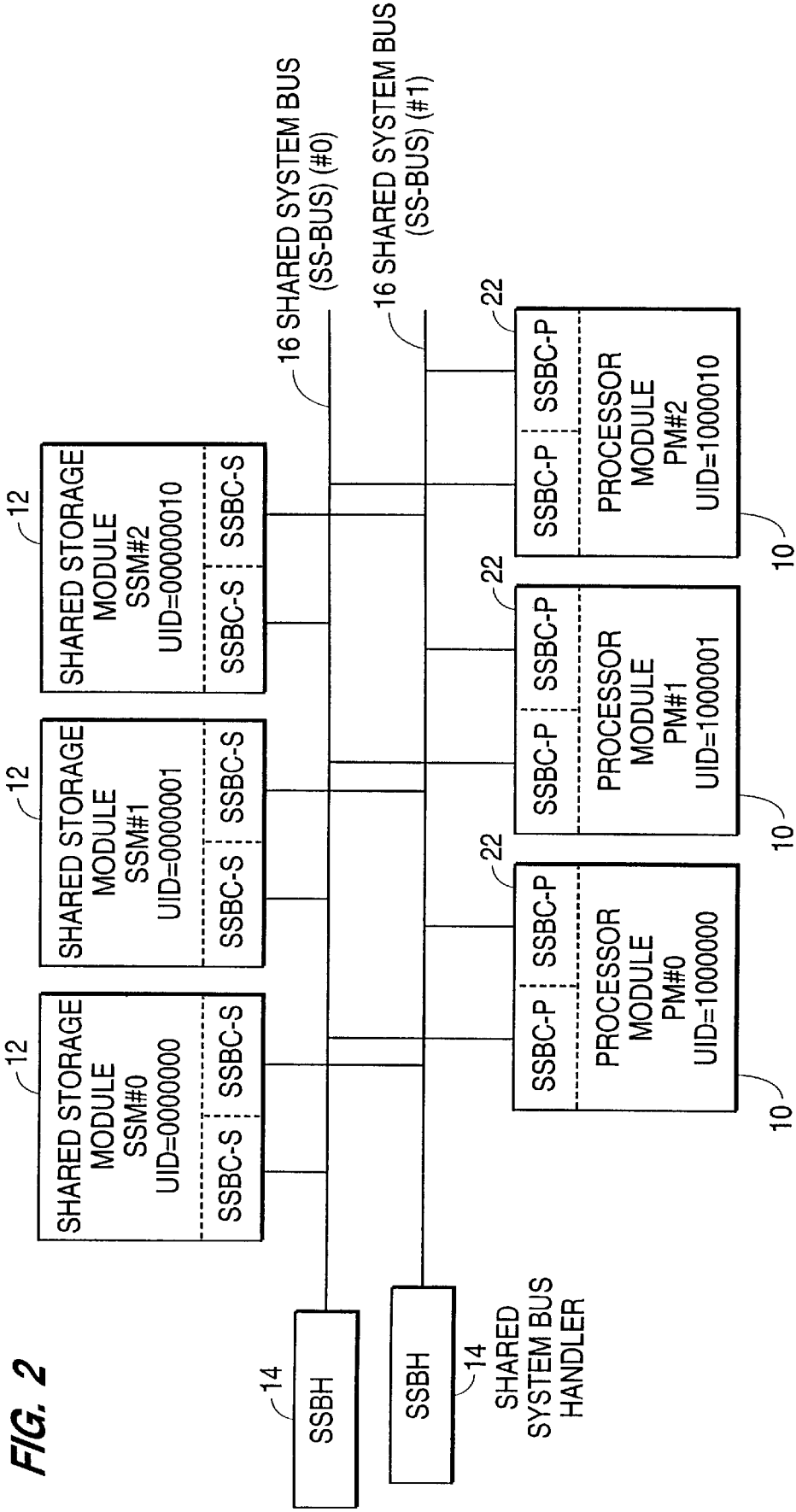
FIG. 2 illustrates a multiprocessor system configuration of the present invention.

FIG. 2 illustrates a system configuration of a multiprocessor system to which a shared storage configuration system according to the present invention is applied.

The multiprocessor system comprises more than one processor module (PM) 10 and more than one shared storage module (SSM) 12. The processor modules 10 and the shared storage modules 12 are each connected to a shared system bus (SS-BUS) 16, a split bus, through a connection unit (SSBC-P) 22. The shared system bus 16 is controlled by a shared system bus handler (SSBH) 14 and the arbitration of the shared system bus 16 is centrally controlled by the shared system bus handler 14.

The #0 to #2 processor modules 10 have their unit ID numbers allocated as follows:
PM#0; UID=1000000
PM#1; UID=1000001
PM#2; UID=1000010

Also, the #0 to #2 shared storage modules 12 have their ID numbers allocated as follows:
SSM#0; UID=0000000
SSM#1; UID=0000001
SSM#2; UID=0000010

Although the processor modules 10 and the shared storage modules 12 are each controlled by the #0 and #1 shared system bus 16 which is doubled for fault-tolerant purposes, they may be connected to more shared system buses 16.

FIG. 3 is a block diagram of the processor module shown in FIG. 2.

The processor module comprises a central processing unit (μP) 18, a local main memory unit (LSU) 20 and two connection units (SSBC-P) 22 for the two shared system buses 16, which are all connected by an internal bus 24.

In the processor module 10, software (OS) runs on the central processing unit 18 and the main memory unit 20. Pieces of software from the processor modules 10 cooperate with one another to form a distributed OS for performing a set of operations. The central processing unit 18 of each processor module fetches instruction codes only from its main memory unit 20.

FIG. 4 is a block diagram of the shared storage module 12 shown in FIG. 2.

The shared storage module 12 comprises a shared storage unit (SSU) 24 and two connection units (SSBC-S) 28 corresponding to the two shared system buses 16, which are all connected by an internal bus 30. The shared storage unit 26 stores data to be shared among the processor modules 10 shown in FIG. 2.

FIG. 5 is a block diagram of the connection unit 22 in the processor module 10 of FIG. 3.

The connection unit 22 accesses the shared storage unit 12 of FIG. 2 via the shared system bus 16 in the following two modes:

(1) program mode
(2) DMA mode

The connection unit 22 comprises a program mode access control circuit 32 and a DMA mode access control circuit 34, which are provided for the two access modes. It further comprises a transmitter-receiver circuit 36 for transmitting data to or receiving data from the shared system bus 16 and a dual port RAM 38, which serves as a buffer. The program mode control circuit 32 comprises an address decoder 40, a timing controller 42, and a configuration definition register 44. The DMA mode access control circuit 34 comprises an address generator 46, a timing controller 48 and a DMA control register 50.

Figure 6:
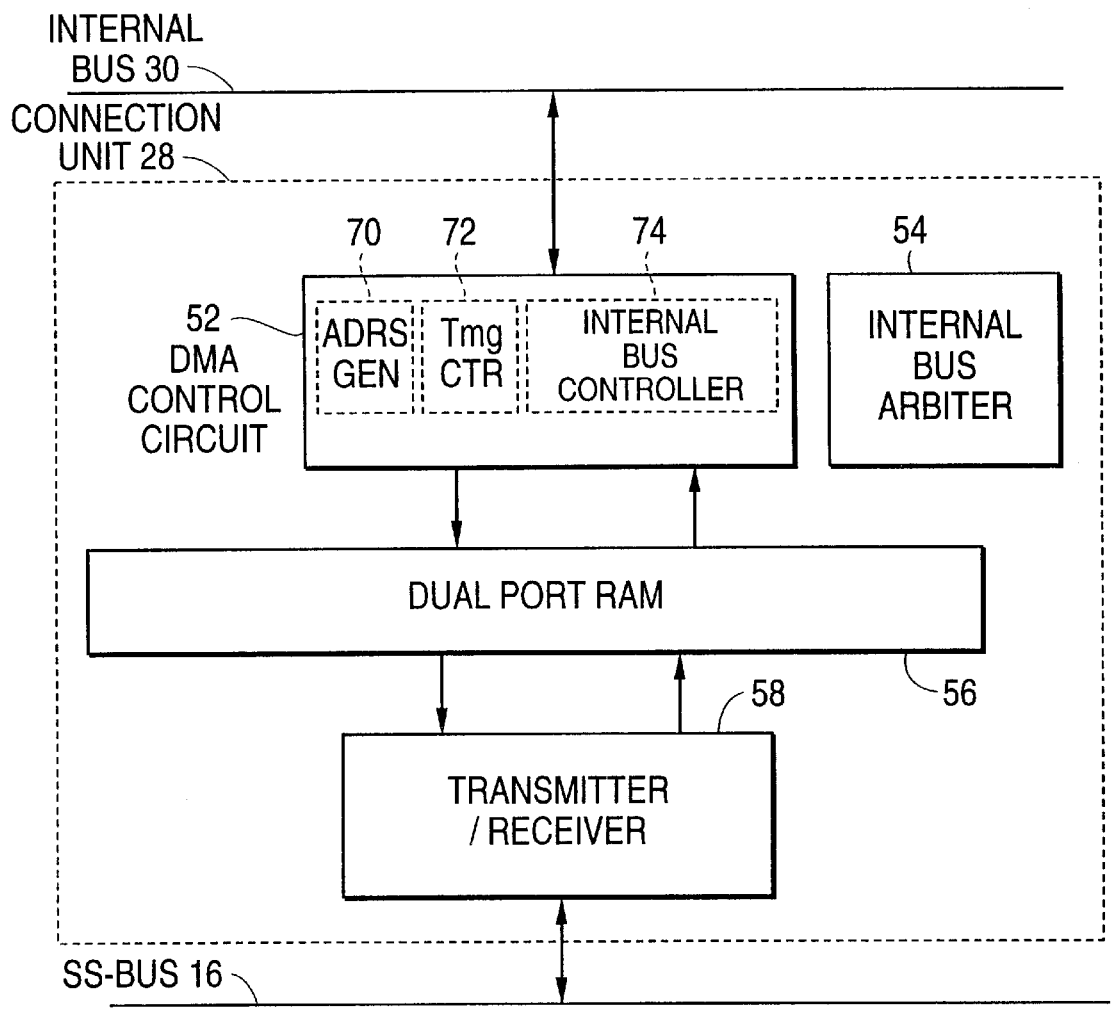
FIG. 6 is a block diagram of a connection unit of the present invention, which is built in the shared storage module.

FIG. 6 is a block diagram of the connection unit (SSBC-S) 28 of the shared storage module 12 shown in FIG. 4.

The connection unit 28 is constructed from a DMA control circuit 52 an internal bus arbiter circuit 54, a transmitter-receiver circuit 58, and a dual port RAM 56. The DMA control circuit comprised of an internal bus control circuit 74 for controlling the internal bus 30, an address generator 70 and a timing controller 72; the internal bus arbitrator circuit 54 performs the arbitration of the internal bus 30 when more than one connection unit 28 is installed in the shared storage module 12, as shown in FIG. 4; the transmitter-receiver circuit 56 is for the shared system bus 16; and the dual port RAM 58 serves as a buffer.

The connection units 22 and 28, which make connections among the processor modules 10 and the shared storage modules 12 via the shared system bus 16, adopt a split transfer system in which each access is split into start transfer and response transfer.

In the bus control of the split transfer system, a unit ID number is allocated to each module, the unit ID being used as a module identifier on the bus.

Figure 7:
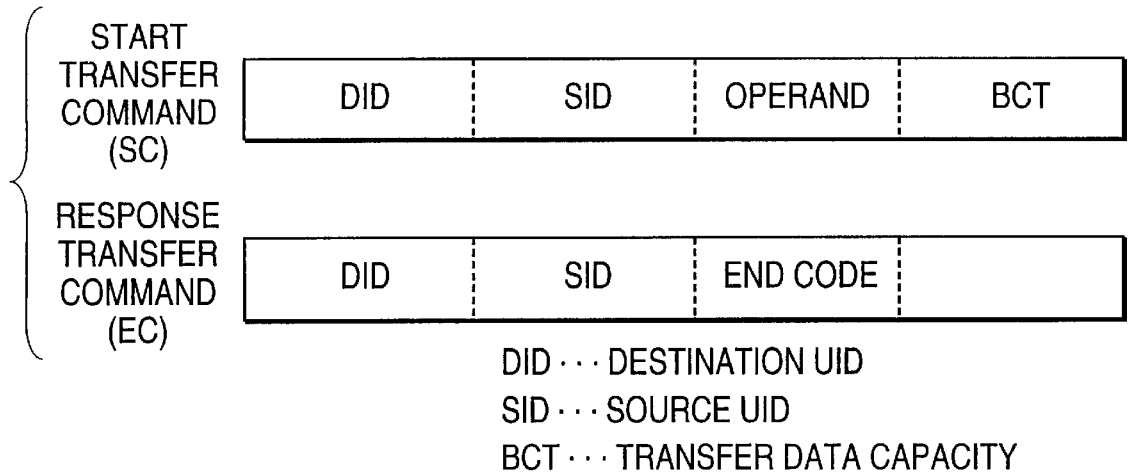
FIG. 7 is a diagram for explaining transfer commands on the system bus according to the present invention.

FIG. 7 illustrates examples of a start transfer command SC and a response transfer command EC used by the connection units 22 and 28.

In the start transfer command SC of FIG. 7, the DID (Destination ID) indicates the unit ID of a destination module and the SID (Source ID) indicates the unit ID of a source module. The operand indicates a type of access. The types of access include memory access to the shared storage modules 12, access to the shared storage units 12 and the other processor modules 10 to halt them and access to the control register to reset it. The BCT (Byte Count) indicates data capacity in accessing the shared storage modules 12.

In the response transfer command EC, the DID and SID plays the same role as those in the start transfer command SC and the conclusion code indicates a conclusion state of the destination, i.e., normal conclusion or abnormal conclusion.

Figure 8:
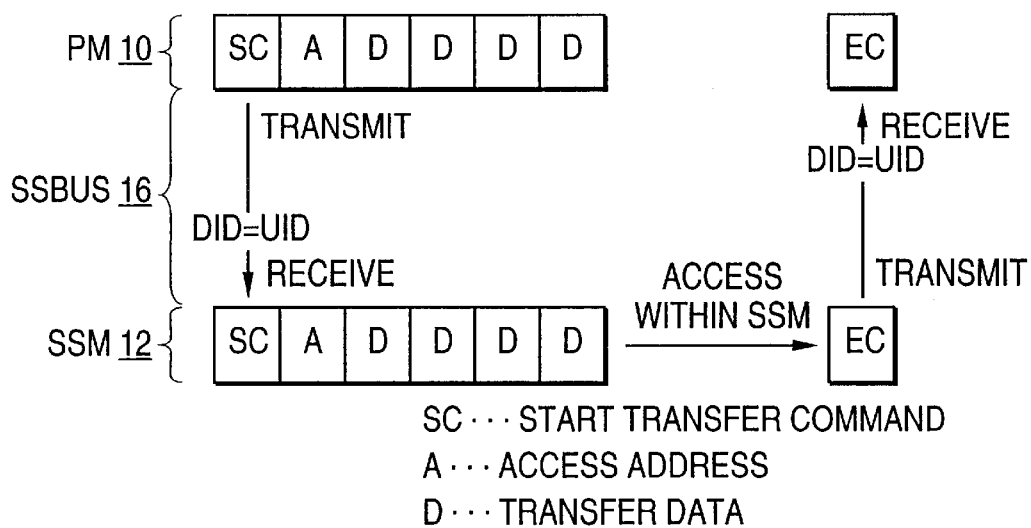
FIG. 8 is a diagram for explaining writing and transfer operations according to the present invention.

FIG. 8 is a diagram for explaining the operation of write access (store access) for transferring data from a source processor module 10 to a shared storage module 12 over the shared system bus 16 and writing it in the memory module 12.

First, the source (accessing) processor module 10 prepares a start transfer command SC. That is, the start transfer command SC prepared by the source processor module consists of the SID indicating its own unit ID, the DID indicating the unit ID of a shared storage module 12 being accessed, an operand indicating the write access and the BCT indicating the access capacity. Following the start transfer command SC, an access address A of the destination shared storage module 12 and data D to be written into are sent onto the system bus 16.

The destination shared storage module 12 monitors the shared system bus 1 6 and compares the DID indicating the destination contained in the start transfer command SC with its own unit ID. When a coincidence occurs, the shared storage module 12 performs a receiving operation. The shared storage module then makes a write access to the shared storage unit 26 (refer to FIG. 4) and transmits to the source processor module a response transfer command EC containing the conclusion code of the write access and in explaining which the DID and SID are interchanged because the start transfer and the response transfer are opposite to each other in the direction of transfer.

The source processor module 10 monitors the shared system bus 16 and performs the receiving operation when a coincidence occurs between the destination ID in the response transfer command EC and its own unit ID, thereby terminating one-time access.

During the idle time from the termination of transmission of the start transfer command SC to the initiation of the transmission of the response transfer command EC, the system bus may be used to transfer the start transfer command SC or the response transfer command EC for another access.

Figure 9:
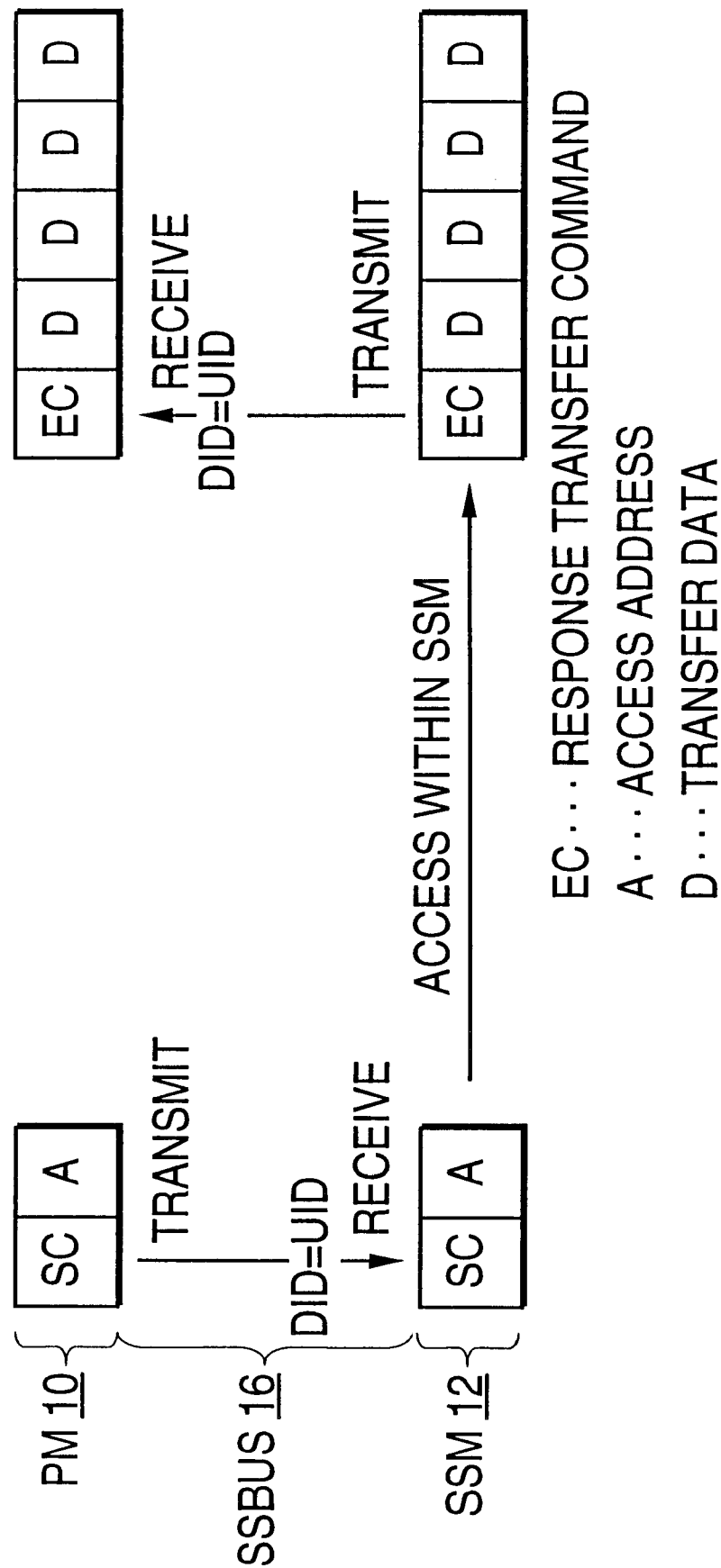
FIG. 9 is a diagram for explaining reading and transfer operations according to the present invention.

FIG. 9 is a diagram for use explaining the operation of read access (fetch access) for reading data from a shared storage module 12 and transferring it to a processor module 10.

First, a source processor module 10 prepares a start transfer command SC which consists of the SID indicating its own unit ID, the DID indicating the unit ID of a destination shared storage module 12 being accessed, an operand indicating the read access and the BCT indicating the access capacity. Following the start transfer command or start command SC, an access address A of the shared storage module 12 being accessed is sent onto the system bus 16.

The destination shared storage module 12 monitors the shared system bus 16 and compares the DID in the start transfer command SC with its own unit ID. When the comparison indicates equality, the module 12 performs the receiving operation. The destination shared storage module 12 then makes read access to the shared storage unit 26 (refer to FIG. 4) of the shared storage module 12 and transmits to the source processor module 10 a response transfer command or end command EC, which contains the conclusion code of the read access, and readout data D. In the response transfer command EC, the DID and SID are interchanged because the start transfer and the response transfer are opposite to each other in the direction of transfer.

The source processor module 10 monitors the shared system bus 16 and performs the receiving operation when a coincidence occurs between the destination ID in the response transfer command EC and in its own unit ID, thereby terminating one-time read access.

The read access is made in the program access mode or the DMA access mode. In either access mode, the operations on the system bus 16 are the same.

Figure 10:
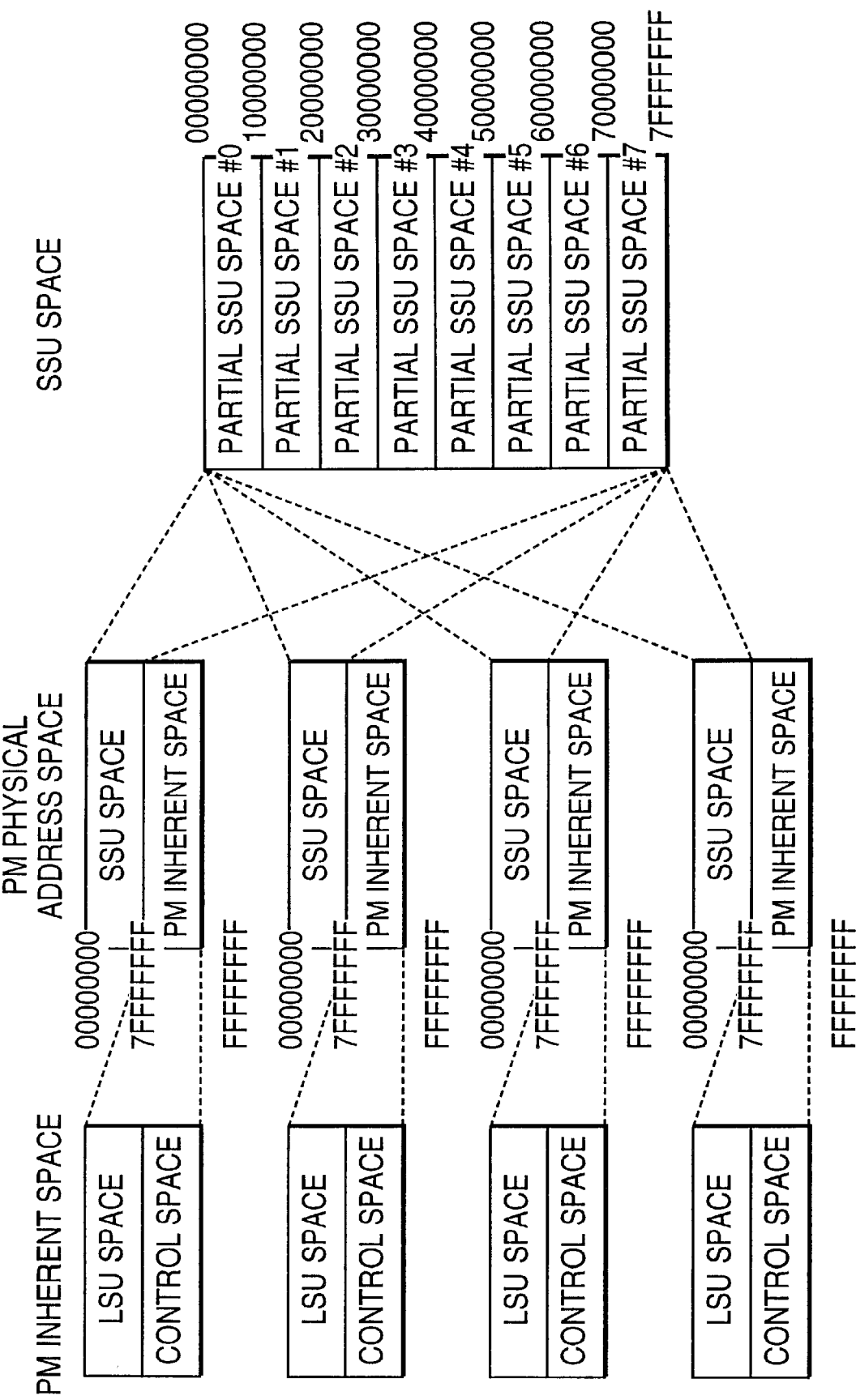
FIG. 10 is a diagram for explaining an address space map according to the present invention.

FIG. 10 is a diagram for explaining an address space map in the present embodiment of the present invention.

In FIG. 10, the physical address space of each processor module is roughly classified into shared storage module space (hereinafter referred to as SSU space) and space inherent in the processor module (hereinafter referred to as PM inherent space).

The PM inherent space is space which is inherent in hardware resources of each processor module 10 and presents in each processor module 10. The PM inherent space forms multiple-address space for the total number of processor modules in the system. In the present embodiment, it is supposed that the amount of PM inherent space is 2 GB.

The SSU space is common to all the processor modules 10. That is, the SSU space is formed by more than one shared storage module 12 and forms space which is common to the processor modules 10 in the system; it can also be directly accessed by the physical addresses of the processor modules 10. Thus, only data to be shared among all the processor modules 10 is stored in the SSU space.

In the present embodiment, the 2-GB SSU space is used as an example. As shown on the right side of the figure, the SSU space is further divided into eight partial SSU spaces #0 to #7 in a 256-MB unit. Each of the partial SSU spaces #0 to #7 is formed from one of the shared storage modules 12 of the present invention.

Moreover, the PM space of each processor module 10 is divided into LSU space and control space. Operands required by each processor module and its own data are stored in the LSU space, which is a part of the PM inherent space. It is the presence of the LSU space that permits the number of accesses made by each processor module to the SSU space (formed by the shared storage modules 12) to be decreased.

If an access address designated by the central processing unit 18 of each processor module points to the LSU space, then closed access will be made within the processor module 10.

When the access address (physical address) designated by the central processing unit (CPU) 18 points to the SSU space, the connection unit 22 of the processor module 10 recognizes, by the access address form the CPU 18, that the access is being made to the SSU space and accesses a corresponding shared storage module 12 via the system bus 16.

By mapping the SSU space and the LSU space into the physical address space on the processor modules 10, it becomes possible for software to access the SSU space and the LSU space without needing to switch between the SSU space and the LSU space.

Since the SSU space is directly mapped into the physical address space of each processor module as shown in FIG. 10, access to the SSU space formed of more than one shared storage module 12 may be made in the following two access modes.

(1) Program mode in which physical addresses are used to make direct access by software instructions of the central processing unit 18; or (2) DMA mode in which a shared storage module to be accessed is selected and a data transfer between a processor module 10 and the shared storage module 12 is started by specifying an access address and the length of transfer.

The accessible SSU space varies with the access mode. In the present embodiment, the SSU space accessible by the program mode is only the 2-GB space which has been directly mapped into the physical address space of each processor module. In the DMA mode, however, by designating a shared storage module 12 to be accessed using its unit ID, it becomes possible to access much vaster SSU space, i.e., extended SSU space.

In the DMA mode access, the unit ID of a shared storage module 10 to be accessed is designated by the DID in the start transfer command SC shown in FIGS. 8 and 9 and the shared storage module is addressed by the following address A. Therefore, theoretically, it becomes possible to access extended SSU space having a capacity of $2^n$ (n is an address bit width of central processing unit 18 plus a bit width of the unit ID). That is, the extended SSU space forms multiple spaces which are distinguished by the unit ID numbers serving as identifiers.

Figure 11:
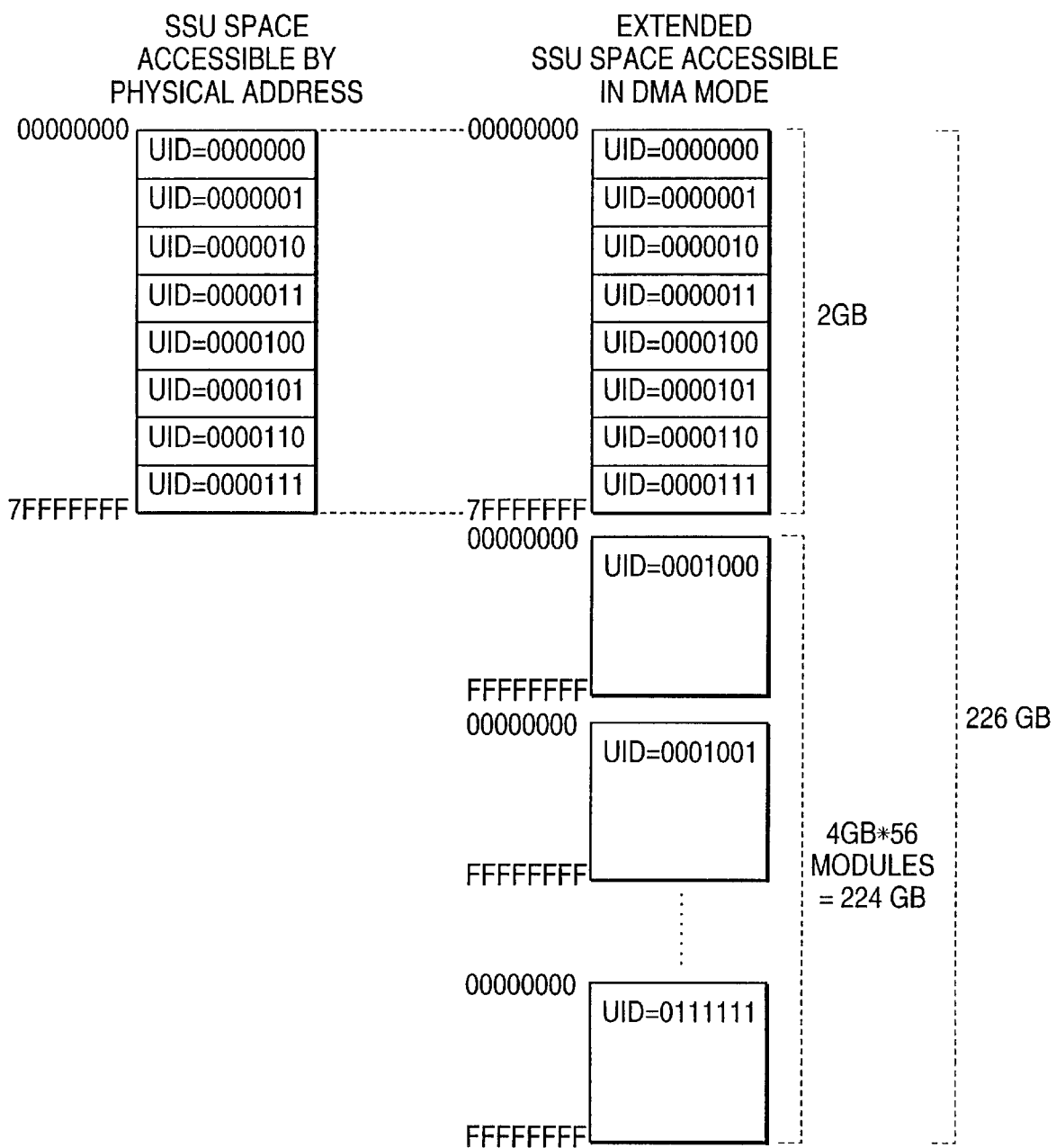
FIG. 11 is a diagram for explaining extended SSU space according to the present invention.
Figure 14:
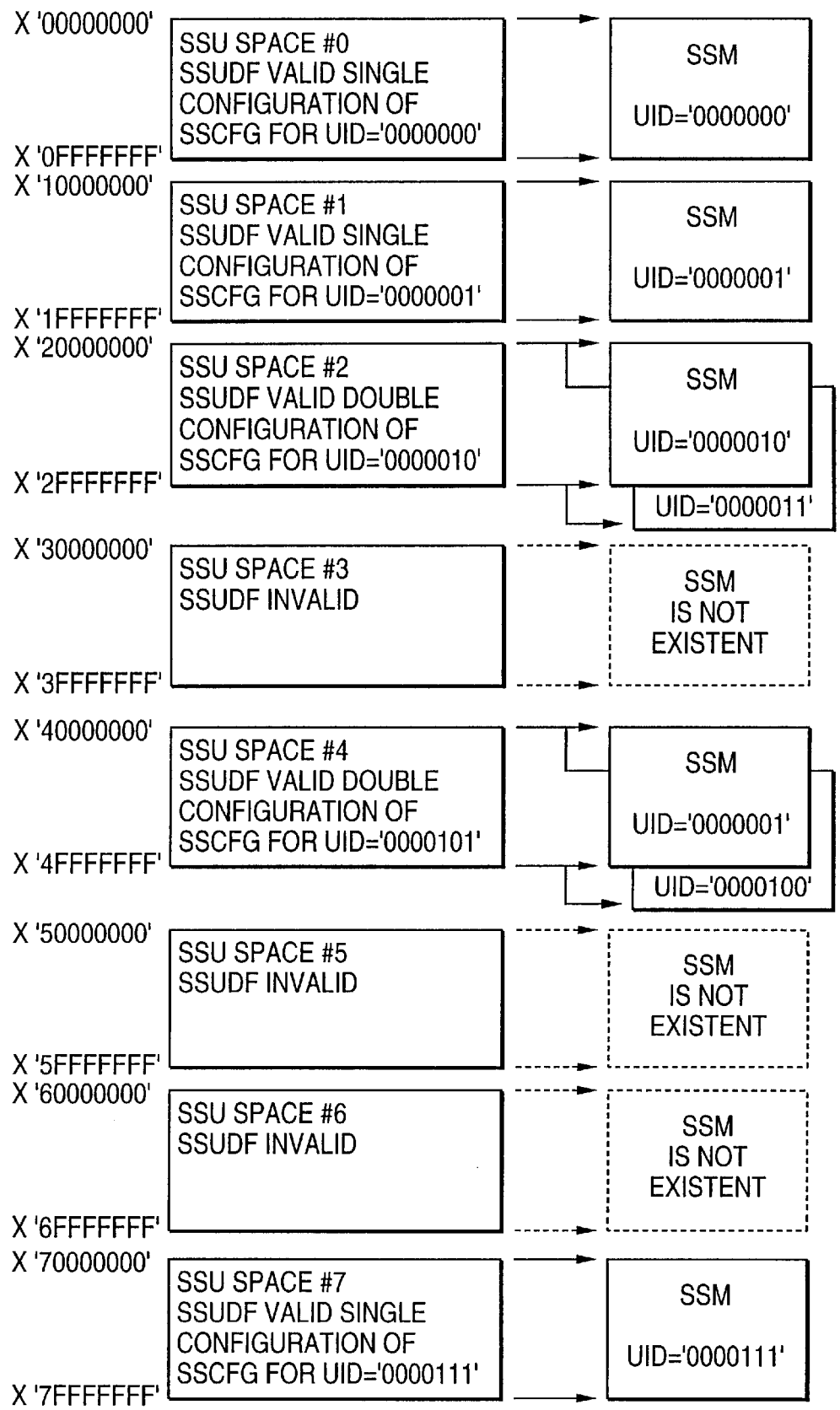
FIG. 14 is a diagram for explaining packaging of the shared storage modules corresponding to the configuration definitions of FIGS. 12 and 13.

FIG. 11 is a diagram for explaining the SSU space which has been mapped into the physical address space of the processor module 10 and the extended SSU space which is accessible only in the DMA mode.

In FIG. 11, the number of bits of each of the unit ID numbers of the shared storage modules 12 constituting the extended SSU space is seven, and 64 unit ID numbers, 0000000 to 0111111, are assigned to the shared storage modules 12.

Here, eight unit ID numbers, 0000000 to 0000111, which are accessible in the program mode and the DMA mode are assigned to the 2-GB physical address space to be used for configuration definitions of the shared storage modules 12 constituting double-shared storage (described later). The remaining 56 unit ID numbers corresponding to 56 SSU modules used in DMA mode are each assigned 4 GB. As a result, the extended SSU space of 226 GB in total can be accessed in the DMA mode.

Figures 1, 16A:
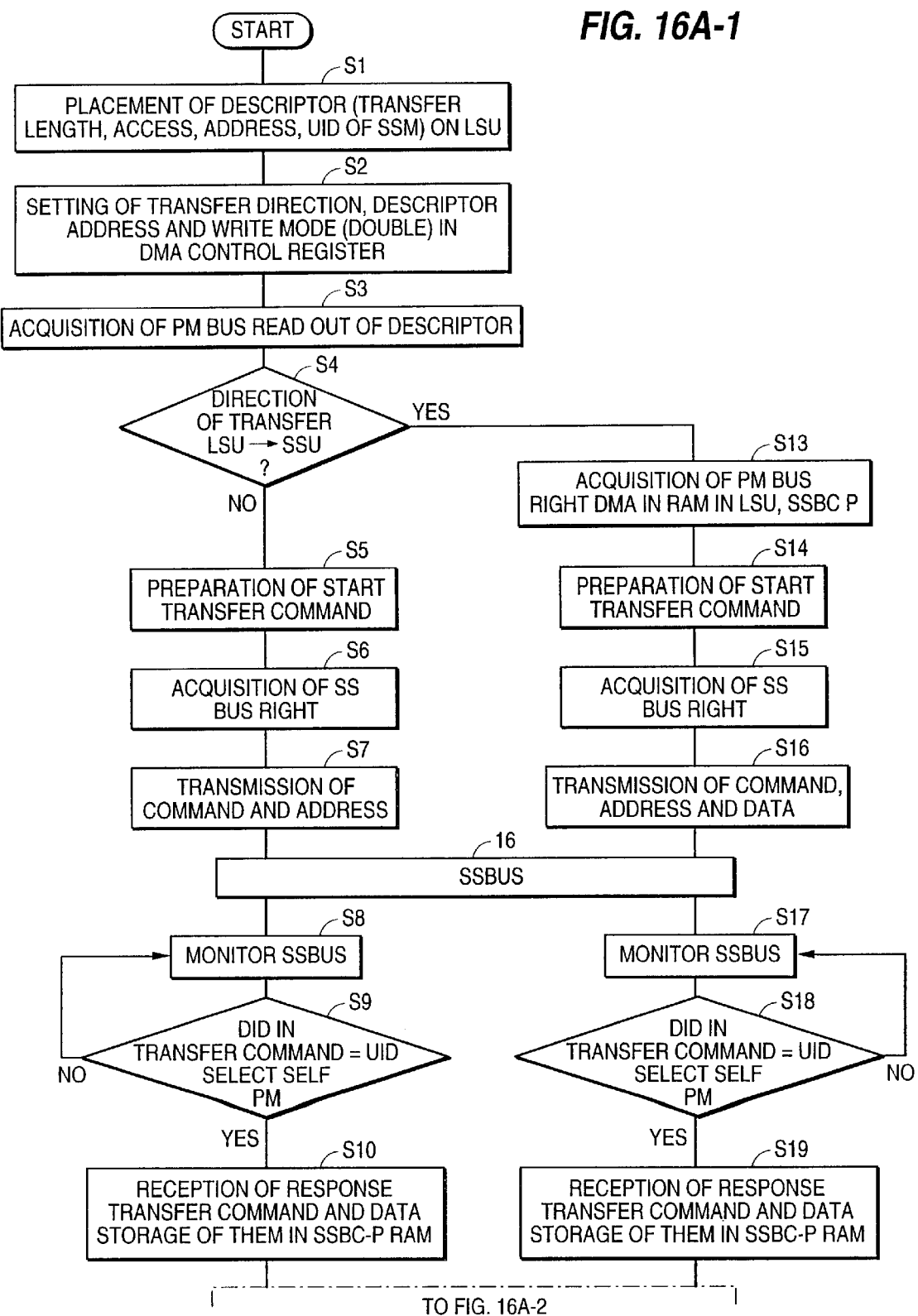
Figures 2, 16A:
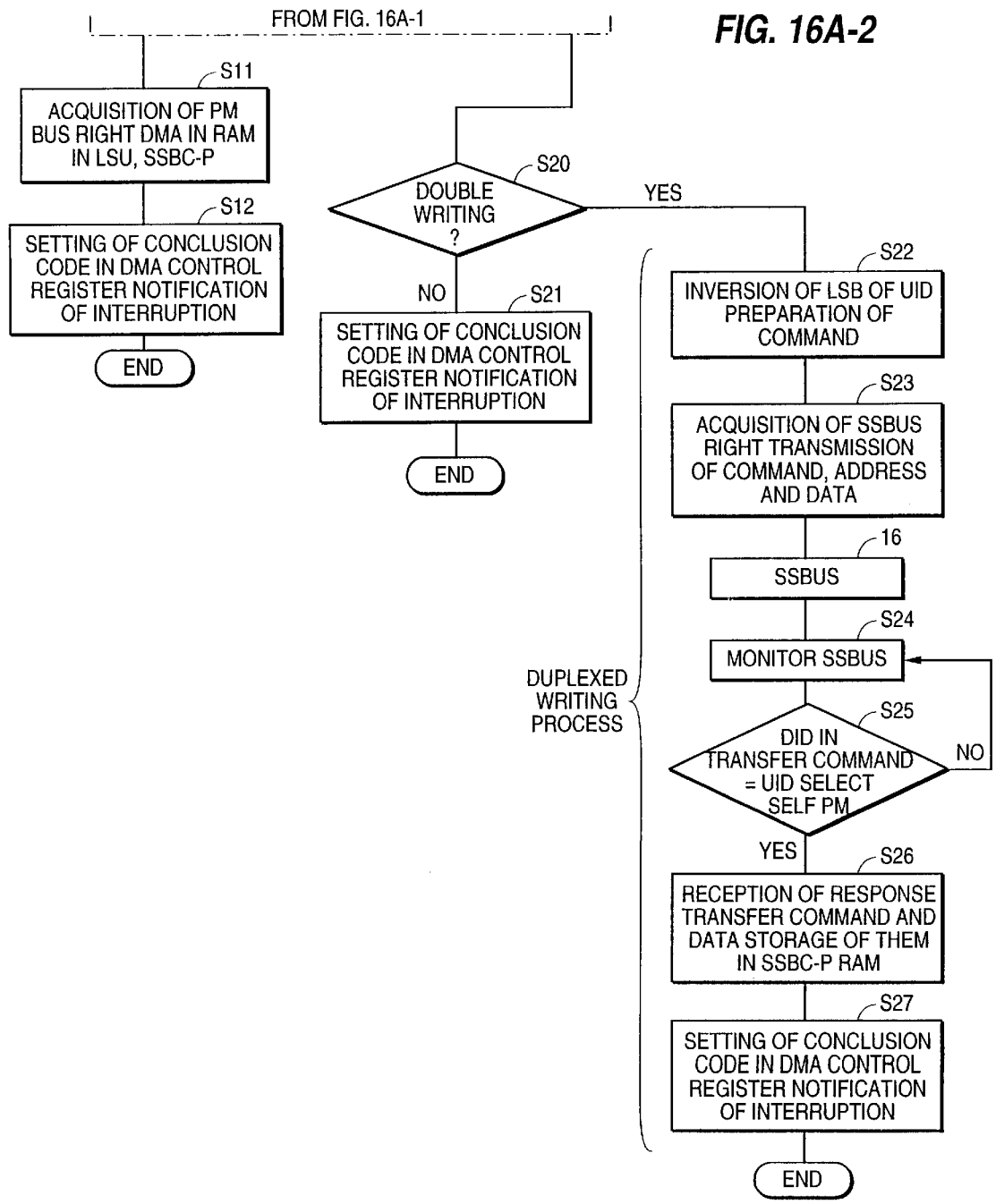

Of course, the number of unit ID numbers is not limited to eight as shown in FIG. 11, and 16 shared storage modules 000000 to 0001111, may be used to fully form double-shared storage space (non-extended 2-GB space).

Moreover, by increasing the number of bits of the unit ID or the rate of assignment of the unit ID numbers to the shared storage modules 12, it is possible to extend the extended SSU space with the DMA mode access.

Although the SSU space of the present invention, which is accessible by the physical addresses, is formed by more than one shared storage module 12, all the memory devices for the SSU space need not be packaged; unpackaged areas may also exist. In addition, all or part of the SSU space may be double-configured for fault-tolerance.

The unpackaged areas and the double configuration, as shown in the SSU space of the processor modules 10 of FIG. 10, can be realized by dividing the SSU space of the processor modules 10 into partial SSU spaces and defining relationship with the shared storage modules 12 for each of the partial SSU spaces, that is, relationship with the shared storage modules 12 having the unit ID numbers 0000000 to 0000111 forming the extended SSU space shown in FIG. 11.

In the embodiment of FIG. 10, the 2-GB SSU space is divided into 8 spaces each of 256 MB and the configuration definitions indicating the correspondence relationship of each of the partial SSU spaces #0 to #7 to the shared storage modules 12 are given.

The configuration definitions of the shared storage modules 12 are realized by operating the configuration definition register 44 (refer to FIG. 5) built in each processor module. The configuration register 44 is constructed from a first control register 60 shown in FIG. 12 and second control registers 62-1 and 62-2 shown in FIG. 13.

The first control register 60 of FIG. 12 specifies the presence or absence of the shared storage modules 12 corresponding to the SSU space divided into 8 spaces each of 256 MB as shown in FIG. 10, in other words, whether the shared storage modules 12 are packaged or unpackaged. In this embodiment, FIG. 12 indicates that five partial SSU spaces #0, #1, #2, #4, #7 corresponding to I0, I1, I2, I4, I7 each indicated by a high bit (1) have been packaged and three partial SSU spaces #3, #5, #6 corresponding to I3, I5, I6 each indicated by a low bit (0) have not been packaged.

The second control registers 62-1 and 62-2 shown in FIG. 13 specify which of the shared storage modules 12 correspond to the partial SSU spaces indicated by high bits in the first control register 60 and have thus been packaged, the single or double configuration and the access sequence when the double configuration is specified.

In this embodiment, only bits D0, D1, D2, D4, and D7 corresponding to the partial SSU spaces #0, #1, #2, #4 and #7 are valid and specify the configurations of corresponding shared storage modules 12 and access forms. That is, bits D0, D1 and D7 are 0s, indicating that the partial SSU spaces #0, #1 and #7 are of single configuration. When partial SSU spaces #0, #1 and #7 are accessed, the shared storage modules 12 identified by the unit ID=0, 1, 7 are accessed.

On the other hand, bits D2 and D4 are is, defining the double configuration. When the partial SSU spaces #2 and #4 of double configuration are accessed, data is read from the shared storage modules identified by the unit ID2 and the unit ID4.

The shared storage modules of double configuration are written into as follows. In the first writing, a shared storage module 12 identified by the unit ID in the second control register 62-1 and 62-2 is written into and, in the second writing, another shared storage module 12 is written into which has the unit ID in which a specific bit in the first unit ID, for example, the least significant bit is inverted.

A pair of duplex shared storage modules 12, which can be specified by the second control register to take the double configuration, has unit ID numbers which are equal except for their least significant bits, e.g. 0000100 and 0000101.

In the embodiment of FIG. 13, two partial SSU spaces #2 and #4 are specified by bits D2 and D4=1 to take double configuration. For the partial SSU space #2, the following pair is set.

| Partial SSU space | Unit ID |
|---|---|
| #2 | 0000010 |
| #3 | 0000011 |

For the partial SSU space #4, the following pair is set.

| Partial SSU space | Unit ID |
|---|---|
| #4 | 0000100 |
| #5 | 0000101 |

Figures 1, 15A:
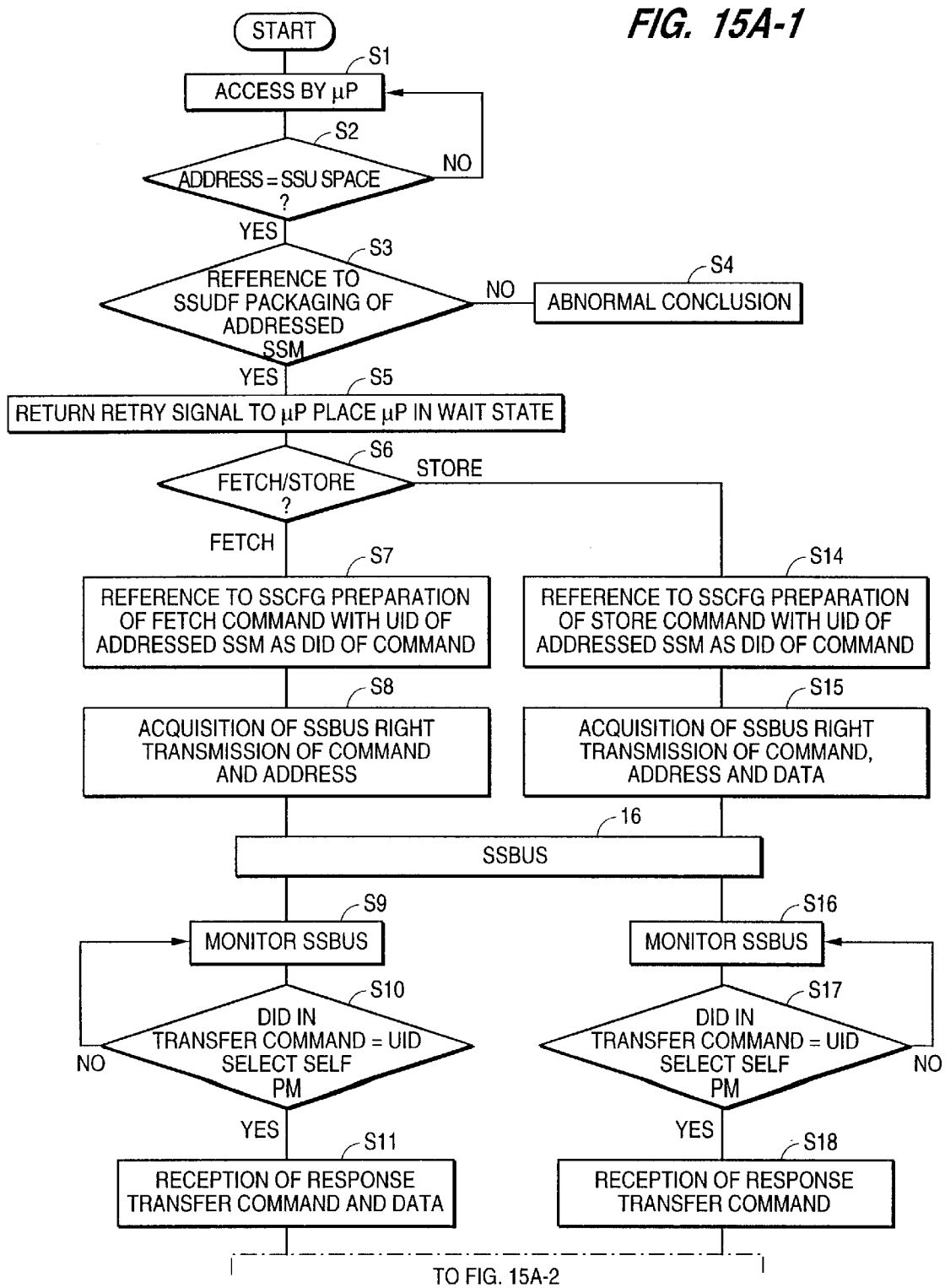
FIGS. 15A and 15B are flowcharts of an accessing process in the program mode according to the present invention.

FIG. 1 4 is a diagram for explaining the packaged state and configuration definitions of the shared storage modules 12 which are based on the specifications by the second control registers of FIGS. 12 and 13.

Eight shared storage modules 12 are provided to correspond to the SSU spaces #0 to #7 of the processor modules 10, but the shared storage module corresponding to the SSU space #6 is not packaged. Since the SSU spaces #3 and #5 are doubled with the shared storage modules of the SSU spaces #2 and #4, respectively, no shared storage modules 12 corresponding to the SSU spaces #3 and #5 exist. The remaining SSU spaces #0, #1 and #7 have a one-to-one correspondence with the shared storage modules 12 because of their single configuration.

By dividing the SSU space which can be accessed by the physical addresses of the processor modules 10 and giving configuration definitions thereof as described above, it becomes possible to specify validity/invalidity or single/double configuration of the shared storage modules for each of the divided SSU space units even when the system is implemented.

In this embodiment, in the program mode in which the SSU spaces are directly accessed by the physical addresses based on the central processing unit software instructions, four bits b0 to b3 in the 32-bit SSU space address serve as a selector for the shared storage modules 12 and the remaining 28 bits b4 to b31 serve as an address of the shared storage units 12.

Where the memory capacity built in the shared storage modules 12 exceeds 256 MB, the meaning of the selector for selecting from among the shared storage modules 12 remains unchanged, but the internal addresses of the shared storage modules 12 are made to correspond to the memory capacity built into the shared storage modules 12. When, for example, the memory capacity is 512 MB, i.e. double 256 MB, 29 bits b3 to b31 of address information are used to designate internal addresses of the shared storage modules 12. When the memory capacity is 1 GB, 30 bits b2 to b31 are used to designate internal addresses of the shared storage modules 12. Moreover, when the memory capacity is extended up to 2GB, 31 bits are all used to designate internal addresses of the shared storage modules. Where the memory capacity of the shared storage modules 12 exceeds 256 MB, the number of bits of the selector for selecting from among the shared storage modules decreases as described above. Thus, the same unit ID will be specified for the partial SSU spaces divided into 256-MB units corresponding to the packaged memory capacity.

Figure 15B:
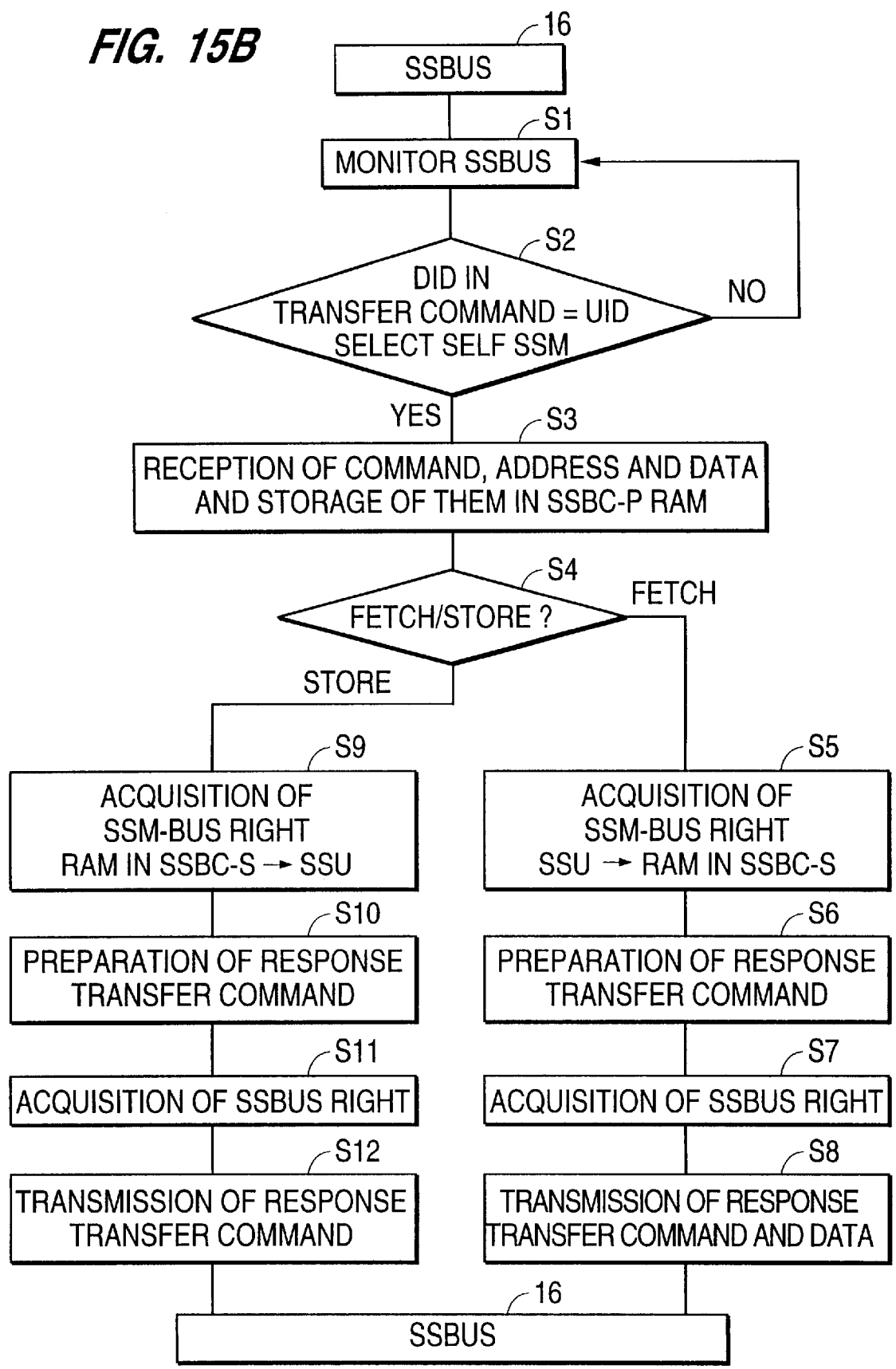

In the present invention, access in the program mode is made in accordance with flowcharts shown in FIGS. 15A and 15B.

In FIG. 15A, software accesses the SSU space as an instruction of the central processing unit in step S1. In step S2, the connection unit 22 decides which of the shared storage units 12 has the addressed SSU space on the basis of four address bits b0 to b3 from the central processing unit 18 and the contents of the second control registers 62-1 and 62-2 for giving configuration definitions of the shared storage modules 12. Moreover, a decision is made in step S3 as to whether or not the shared storage module 12 specified by the contents of the first control register 60 has been packaged. If it has not, the operation will be terminated abnormally in step S4.

When it is decided in step S3 that the shared storage module 12 specified by the second control registers is packaged, the connection unit 22, in step S5, returns a retry signal to the central processing unit 18, so that the central processing unit 18 is placed in the wait state.

In step S6, a decision is made as to whether an instruction from the central processing unit 18 is a fetch instruction to read data from the shared storage module 12 or a store instruction to write data into the shared storage module 12.

If the instruction from the central processing unit 18 is a fetch instruction, a start transfer command SC is prepared in step S7 from the contents of the second control registers 62-1 and 62-2 with the unit ID of the destination shared storage module used as the DID. After the bus right for the shared system bus 16 has been acquired in step S8, the start transfer command SC and address A are transmitted to the shared system bus 16.

If, on the other hand, it is decided in step S6 that the instruction is a store instruction, a start transfer command SC is likewise prepared in step S14 from the contents of the second control registers 62-1 and 62-2 with the unit ID of the destination shared storage module used as the DID. In step S14, the start transfer command SC, address A and data D to be written into are sent onto the shared system bus 16 after acquisition of the bus right for the shared system bus 16.

In the shared storage module 12, on the other hand, as shown in the flowchart of FIG. 15B, the connection unit 28 monitors the shared system bus 16 in step S1 and compares its unit ID with the DID in the start transfer command in step S2. When the comparison indicates equality, receive data is written into the built-in dual port RAM 56 in step S3.

In step S4, it is determined whether the instruction is a fetch instruction or a store instruction.

If it is a fetch instruction, the connection unit 28 permits data transfer between the dual port RAM 56 and the shared storage unit 26 under the control of the internal bus control circuit 64 in step S5 after acquisition of the bus right for the internal bus 30. In step S5, the connection unit 28 responds to the source processor module 10 at the termination of data transfer within the shared storage module 12.

That is, a response transfer command EC containing a conclusion code is prepared in step S6, bus right for the shared system bus 16 is acquired in step S7, and then the response transfer command EC and readout data D are sent onto the shared system bus 16 in step S8.

If in step S4 the instruction is determined to be a store instruction, the connection unit 28 permits data transfer between the dual port RAM 56 and the shared storage unit 26 in step S9 under the control of the internal bus control circuit 64 after acquisition of the bus right for the internal bus 30. The connection unit 28 responds to the source processor module 10 at the termination of the data transfer (the writing of data) within the shared storage module 12.

That is, a response transfer command EC containing a conclusion code is prepared in step S10, the bus right for the shared system bus 16 is acquired in step S11 and then the response transfer command EC is sent onto the shared system bus 16 in step S12.

Returning to the flowchart of FIG. 15A for the processor modules, the connection unit 22 monitors the shared system bus 16 as indicated in step S9 or S16 and compares its own unit ID with the DID in the response transfer command EC in step S10 or S17. When the comparison indicates equality in step S10 or S17, the response transfer command EC and data D are received in step S11 for a fetch instruction or the response transfer command EC is received in step S18 for a store instruction.

In subsequent step S12 or S20, a retry signal issued to the central processing unit 18 is withdrawn, so that the wait state of the central processing unit 18 is canceled. For a fetch instruction, a conclusion signal of the internal bus 24 is returned to the central processing unit 18 together with received data D in step S13. For a store instruction, a conclusion signal DC of the internal bus 24 is returned to the central processing unit 18 in step 20.

The access in the program mode is thus terminated.

The double writing process in steps S19 and S22 to S28 of FIGS. 15A will be clarified later.

Next, reference is made to the flowcharts of FIGS. 16A and 16B to describe access in the DMA mode of the present invention.

Figure 17:
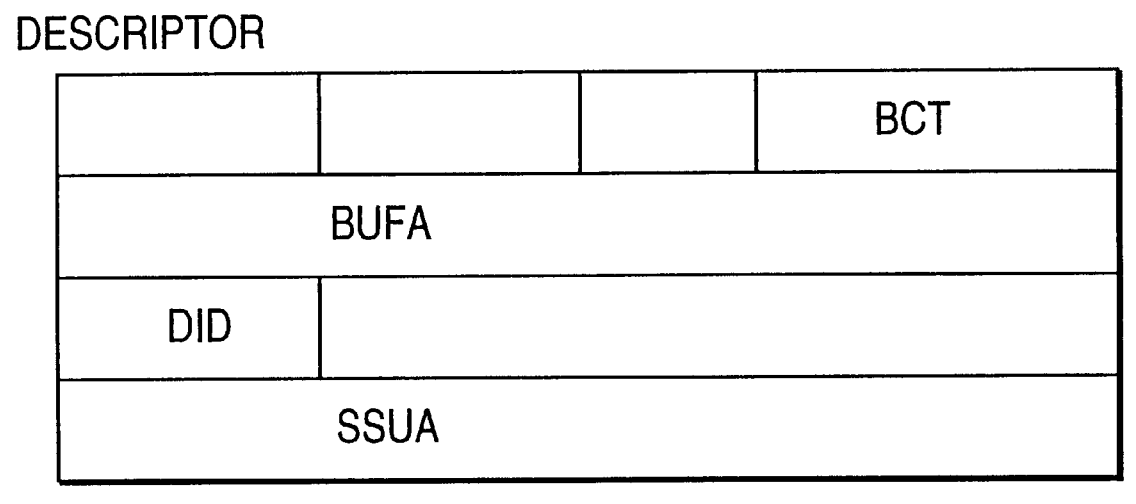

For access in the DMA mode, in step S1, the central processing unit 18 first places on the main memory 20 of the processor module 10 a descriptor containing control contents, such as the unit ID of a destination shared storage module 12, an access address, the transfer length, etc., shown in FIG. 17.

That is, in the descriptor of FIG. 17, the BCT indicates the number of transfer bytes, the buffer address BUFA indicates the start physical address of the data buffer placed on the main memory 20, and the DID indicates the unit ID of a shared storage module which is a candidate for access. Moreover, the SSUA indicates a relative address (an internal address within the shared storage module 12 specified by the DID) within the shared storage module 12 to be accessed, which differs from the physical address of the SSU space in the program mode.

After placement of the descriptor in step SI, the direction of transfer, double writing into the shared storage modules 12 and the address of the descriptor on the main memory 20 are set in the DMA control register 50 of the DMA control circuit 34 in the connection unit 22 in step S2, thereby starting DMA mode access.

When the DMA mode access is started in step S2, the connection unit 22 acquires the bus right for the internal bus 24 of the processor module 10. Thus, in step S3, the connection unit 22 is permitted to directly access the main memory 20 under the control of the DMA control circuit 34 to thereby read the descriptor from the main memory 20 and permit data transfer from the main memory 20 to the dual port RAM 38 in the connection unit.

After termination of data transfer to the dual port RAM 38 in the connection unit 22, the direction of data transfer is checked in step S4. If the readout data transfer direction is from the shared storage module 12 to the main memory 20 (hereinafter referred to as (SSU → LSU) direction), a start transfer command SC containing the unit ID of the shared storage module 12 and the length of transfer as shown in FIG. 7 is prepared by the transmitter-receiver circuit 36 in step S5. On the other hand, if the write data transfer direction is from the main memory 20 to the shared storage module 12 (hereinafter referred to as (LSU → SSU) direction), the transfer start command SC is likewise prepared by the transmitter-receiver circuit 36 in step S13.

Subsequently, the transmitter-receiver circuit 36 acquires the bus right for the shared system bus 16 in steps S6 and S14.

If the transfer is in the (SSU → LSU) direction, the operation proceeds from step S6 to step S7, so that the start transfer command SC and the address A are sent onto the shared system bus 16. If the transfer is in the (LSU → SSU) direction, the operation proceeds from step S15 to step S16, so that the start transfer command SC, address A and data D are transmitted to the shared system bus 16.

On the other hand, the connection unit 28 of the shared storage module 12 monitors the shared system bus 16 in step S1 of FIG. 16B and compares its unit ID with the DID in the start transfer command DC in step S2. When the comparison indicates equality, the connection unit writes received data into the dual port RAM 56 in step S3.

Next, the transfer direction is checked in step S4. When the transfer is in the (SSU → LSU) direction, the operation proceeds to step S5. When the transfer is in the (SSU → LSU) direction, the operation proceeds to step S9. In step S5 or S9, the internal bus control circuit 64 of the DMA control circuit 52 in the connection unit 28 acquires the bus right for the internal bus 30, so that data transfer is permitted between the dual port RAM 56 and the shared storage unit 26. In this case, data is read from the shared storage unit 26 in step S5, while data is written into the shared storage unit 26 in step S9.

When access in the DMA mode is terminated in step S5 or S9, the response transfer command EC containing the conclusion command shown in FIG. 7 is prepared in step S6 or S10 and the bus right for the shared system bus 16 is acquired in step S7 or S11. Then, the operation proceeds to step S8 or S12. That is, in step S8 in which (LSU → SSU), readout data D is added to the response transfer command EC and then transmitted to the shared system bus 16. In step S12 in which (SSU → LSU), the response transfer command EC is transmitted to the shared system bus.

Returning now to the flowchart of FIG. 16A for the processor modules 10, the connection unit 22 of the processor module 10 monitors the shared system bus 16 as in step S8 or S17. When equality is found between its unit ID and the DID in the response transfer command, the operation proceeds to step S10 or S19 for a receiving operation. The received data is stored in the dual port RAM 38 in the connection unit 22.

Subsequently, for transfer in the (SSU → LSU) direction, the bus right for the internal bus 24 is acquired in step S11, so that data D received by the dual port RAM 38 is transferred to the main memory 20 under the DMA control. Finally, the conclusion code is set in the DMA control register 50 in step S12 and the completion is notified to the central processing unit 18 as an interruption signal.

For transfer in the (LSU → SSU) direction, the operation proceeds to step S21 via step S20, whereby the conclusion code is set in the DMA control register 50 and the completion is notified to the control processing unit 18 as an interruption signal.

One-time access in the DMA mode is thus terminated.

The double writing process in steps S20 and S22 to S27 will be clarified Later.

The shared storage modules 12 constituting the SSU space of the present invention can be doubled for fault-tolerance. When doubled shared storage modules 12 are accessed, the writing operation is performed on both of the doubled shared storage modules, while the reading operation is performed on one of the shared storage modules 12.

The write access to the doubled shared storage modules 12 is carried out by hardware control of the connection unit 22 in response to an access instruction from the central processing unit 18 based on software. The write access to the doubled shared storage modules is not made simultaneously for reasons of hardware control. That is, the writing operation is first performed on one of the shared storage modules and, when the first writing operation is completed, the other is written into. The specific accessing methods vary between the program mode and the DMA mode.

The double accessing method in the program mode is performed in accordance with the process in steps S19 and S22 to S28 shown in FIG. 15A.

That is, the first store access is processed in the same manner as in the single configuration. When, in step S18, a response transfer command EC indicating normal termination is received at the termination of the first write access to the shared storage module 12, a reference is made in step S19 to the second control registers 62-1 and 62-2.

Into the second control registers 62-1 and 62-2 are entered a bit for specifying the double configuration of shared storage modules, the unit ID of a shared storage module to be read from and the unit ID of a shared storage module to be written into first.

When a reference is made to the second control registers 62-1 and 62-2, if the shared storage module to be accessed is defined as single configuration, then the connection unit 22 makes the first write access to the shared storage module to be accessed in step S20.

When the double configuration is defined, in step S22, a transfer start command SC for store is prepared in the DID of which is equal to the unit ID of the shared storage module, which is specified first in the second control registers and has already been subjected to access, except the least significant bit. In subsequent step S23, the bus right for the shared system bus 16 is acquired to transmit the start transfer command SC, address A and data D which is the same as that in the first access and accesses the other of the double-configured shared storage modules.

In the second access, with the first access, the process indicated in steps S1 to S4 and S9 to S12 of FIG. 15A is performed by the shared storage modules and, finally, a response transfer command EC containing a conclusion code is transmitted to the shared system bus.

Data transferred from the shared storage module is monitored in step S24 of FIG. 15A and, when equality is found between its own unit ID and the DID in step S25, the response transfer command EC is received in step S26. Thereby, as in steps S12 and S13, a set of store accesses to the double-configured shared storage modules is terminated.

By setting configuration definitions of the shared storage modules in the second control registers as described above, when the central processing unit 18 makes program-mode access (access to the SSU space) to a physical address of a shared storage module on the basis of software, the processor site connection unit 22 checks whether the shared storage unit is of single configuration or double configuration and is able to automatically change the unit ID to make the second access at the termination of the first access if it is of double configuration.

Even if a shared storage module specified in the second control registers 62-1 and 62-2 is defined as double configuration, one of the doubled shared storage modules may be disabled against access because of a fault therein. A situation in which a compressed operation has to be temporarily employed can be coped with by changing the operation mode of the second control registers from the double configuration mode to the single configuration mode when the abnormal conclusion code is found in the response transfer command EC obtained at the termination of access.

When, at the time of double-mode access, access to shared storage modules is terminated abnormally, it is possible to check the presence or absence of equality of the contents of two doubled shared storage modules as well as the access sequence based on the unit ID of the abnormal shared storage module and the contents of the second control registers 62-1 and 62-2. In the program mode in particular, since the success or failure in access can be basically recognized on a word-by-word basis, even if data equality is lost between the double-configured shared storage modules, the recovery process has only to be performed taking into account unequal words and the shared storage module which has failed to be accessed.

Next, the DMA-mode double accessing method is illustrated in steps S20, S22 to S27 of FIG. 16A.

That is, the first DMA access in which data transfer is in the (LSU-SSU) direction is processed in the same manner as in the single configuration. After a response transfer command EC indicating normal termination of the first access to the shared storage module is received in step S19, the presence or absence of the definition of double writing is checked in step S20.

Although the DMA-mode access is started by selecting an object shared storage module and specifying an access address of the shared storage module and the length of transfer, the direction of transfer and single/double configuration are specified in the DMA control register 50 of the connection unit 22.

For this reason, in step S20, reference is made to the DMA control register 50 defining the configuration of the shared storage module to check the presence or absence of the definition of double writing.

As a result of the reference to the DMA control register 50, if the shared storage module to be accessed is defined as single configuration, the process advances to step 21 and the connection unit 22 terminates access to the shared storage unit with only one write access.

However, if the double configuration is defined, a transfer start command SC for writing is prepared in step S22 and has the same DID as the unit ID of the shared storage module, which is first designated in the DMA control register 50 and has already been accessed, except the least significant bit. In subsequent step S23, the bus right for the shared system bus is acquired to transmit the start transfer command SC, address A and data D which is the same as that in the first access to the shared system bus 16, and makes DMA write access to the other of the double-configured memory modules.

In the second DMA access, as with the first, the process in steps S1 to S4 and S9 to S12 shown in FIG. 16B are performed by the shared storage modules and finally a response transfer command EC containing a conclusion code is transmitted to the shared system bus 16.

That is, data transferred from the shared storage module is monitored in step S24 of FIG. 16A and, when an equality is found between its own unit ID and the DID in step S25, the response transfer command EC is received in step S26. As in steps S11 and S12, DMA access writing into the doubled shared storage modules is terminated in steps S26 and S27.

As with the double writing in the program mode, in the DMA mode as well, if the mode of operation is specified, the double writing is automatically performed by the hardware.

Where abnormal termination occurs during DMA access to the doubled shared storage modules, it is possible to check data equality between two doubled shared storage modules as well as the access sequence based on the unit ID being accessed and the least significant bit of the unit ID of the shared storage module specified at the time of the first access.

Although more than one processor module is indicated in the embodiment of FIG. 2, the system may comprise a single processor module.

As described above, according to the present invention, the instruction is separated from the data, thereby decreasing the frequency of access to a shared storage module and increasing the number of processor modules to be equipped with the system. As a result, the present invention can greatly improve system performance.

As the memory area or space co-owned by a plurality of processor modules is decreased, the independence of each processor is increased and thus a more reliable fault-tolerant computer can be configured.

Further, an expanded shared storage space which is accessible by DMA instruction using software is provided and thus a computer system with a vast memory space can be configured.

A duplex configuration can be changed during system operation, thus realizing fault tolerant capabilities depending on the necessary memory volume where duplication is required for shared storage space.

As the hardware twice performs automatic duplicating writes according to the write instruction from the software, the process load of the software can be reduced without any other software process, thus greatly improving system performance.

What is claimed is:

1. A shared storage duplicating method for a computer system comprising process modules each having at least a main memory, a central processing unit, and a connection unit for connection to a system bus; and a plurality of shared storage modules each having at least a shared storage unit and a connection unit for connection to said system bus, said method comprising the steps of:

dividing shared storage space accessible dependent on a physical address into partially-shared storage spaces, said shared storage space corresponding to said plurality of shared storage modules; and defining one of a duplex configuration and a non-duplex configuration of memory modules for each of said partially-shared storage spaces, said duplex configuration of memory modules comprising a pair of memory modules comprising said first shared storage module and said second shared storage module, each of said plurality of storage modules being directly accessible by each of said process modules.

2. A shared storage duplicating method for a computer system including a process module having at least a main memory, a central processing unit, and a connection unit for connection to a system bus; and a plurality of shared storage modules each having at least a shared storage unit and a connection unit for connection to said system bus, each shared storage unit being allocated shared storage space accessible dependent on a physical address of said process module, said method comprising the steps of:

dividing said shared storage space into partially-shared storage spaces;

defining one of a single configuration and a duplex configuration of memory modules for each of said partially-shared storage spaces, said duplex configuration of memory modules formed by a pair of the memory modules in said plurality of shared storage modules, each of said plurality of shared storage modules being directly accessible by said process module; and specifying one of said plurality of shared storage modules by a unit ID having an inverted value at a specific bit in contrast with a unit ID of another of said plurality of shared storage modules.

3. A shared storage duplicating method for a computer system including process modules each having at least a main memory, a central processing unit, and a connection unit for connection to a system bus; and a plurality of shared storage modules each having at least a shared storage unit and a connection unit for connection to said system bus, said method comprising the steps of:

dividing shared storage space accessible dependent on a physical address into partially-shared storage spaces, said shared storage space corresponding to a first shared storage module and a second shared storage module;

defining one of a single configuration and a duplex configuration of memory modules for each of said partially-shared storage spaces, said duplex configuration of memory modules formed by a pair of the memory modules using said first shared storage module and said second shared storage module, each of said first shared storage module and said second storage module being directly accessible by each of said process modules; and specifying said second shared storage module by a unit ID having an inverted value at a specific bit in contrast with a unit ID of said first shared storage module.

4. A shared storage duplicating method according to claim 3, wherein the specific bit is a least significant bit.

5. A shared storage duplicating method according to claim 3, wherein if the duplex configuration is determined by software and according to a first write instruction of a central processing unit, then hardware of a connection unit of a processing module associated with the central processing unit providing the first write instruction performs a first write into said first shared storage module having a specified unit ID and then a second write into said second shared storage module.

6. A shared storage duplicating method according to claim 3, wherein
a connection unit in said process module comprises a configuration definition register for specifying the existence of a duplex configuration of said shared storage module, and performs an access for a duplicating write by referring to said configuration definition register on receiving a write instruction from said central processing unit.

7. A shared storage duplicating method according to claim 3, wherein
the duplex configuration is specified by a configuration definition register and can be changed according to an instruction of a central processing unit based on software.

8. A shared storage duplicating method according to claim 3, wherein
if a connection unit in a process module receives from a central processing unit a read instruction from a pair of shared storage modules where a duplex configuration is specified, only a reading access is performed from a shared storage module having a unit ID determined by the read instruction of said central processing unit.

9. A shared storage duplicating method according to claim 3, wherein
said connection unit in a process module generates a start transmit command comprising a destination ID code indicating a shared storage module to be accessed, a source ID code for indicating the source, an operand indicating the type of access, and access data capacity, and then sends to said system bus said start transmit command together with an access address of a shared storage module at the destination; and
said connection unit in said shared storage module to be accessed monitors said system bus, and accepts said start transmit command when it determines that the destination ID code of said start transmit command and its unit ID match, thereby performing an operand-dependent access.

10. A shared storage configuration method according to claim 3, wherein
said connection unit in a process module comprises hardware for performing a duplicating write according to the specification of a duplex configuration, said hardware comprising:
program mode access control means for accessing said shared storage module dependent on a physical address of a central processing unit; and
DMA mode access control means for accessing said shared storage module after converting the physical address of said central processing unit to a relative address.

11. A shared storage duplicating method according to claim 3, wherein
if an abnormal condition exists during access to one of said plurality of shared storage modules, a termination code describing the abnormal condition and a unit ID of a defective shared storage module are notified to software of a process module.

12. A shared storage duplicating method according to claim 11, wherein
the software of said process module is notified of a termination code describing the abnormal condition and only the least significant bit in the unit ID of the defective shared storage.

13. A shared storage duplicating method according to claim 11, wherein
if the software of said process module receives notification indicating an abnormal termination of a duplex access, a recovery process is performed by changing a content of a configuration definition register provided in said connection unit, said content comprising release of duplication, rewrite instruction, and switch of a shared storage module to be read.

14. A shared storage configuration method according to claim 3 comprising:
a plurality of system buses; and
a plurality of connection units provided in a process module and connection units provided in said shared storage module, each of the connection units provided depending on a number of said system buses.

* * * * *